United States Patent
An et al.

(10) Patent No.: US 11,488,958 B2
(45) Date of Patent: Nov. 1, 2022

(54) SEMICONDUCTOR DEVICE ELECTRODES INCLUDING FLUORINE

(71) Applicant: Samsung Electronics Co., Ltd., Suwon-si (KR)

(72) Inventors: Chang Mu An, Osan-si (KR); Sang Yeol Kang, Yongin-si (KR); Young-Lim Park, Anyang-si (KR); Jong-Bom Seo, Seoul (KR); Se Hyoung Ahn, Seoul (KR)

(73) Assignee: Samsung Electronics Co., Ltd.

( * ) Notice: Subject to any disclaimer, the term of this patent is extended or adjusted under 35 U.S.C. 154(b) by 8 days.

(21) Appl. No.: 16/916,751

(22) Filed: Jun. 30, 2020

(65) Prior Publication Data

US 2021/0125993 A1 Apr. 29, 2021

(30) Foreign Application Priority Data

Oct. 29, 2019 (KR) .................. 10-2019-0135044

(51) Int. Cl.
*H01L 25/065* (2006.01)
*H01L 25/00* (2006.01)
(Continued)

(52) U.S. Cl.
CPC .. *H01L 27/10814* (2013.01); *H01L 27/10823* (2013.01); *H01L 27/10855* (2013.01)

(58) Field of Classification Search
CPC ......... H01L 27/10829; H01L 27/10814; H01L 27/10823; H01L 27/10855; H01L 27/10852; H01L 28/55; H01L 21/32139; H01L 21/32133; H01L 21/32134; H01L 28/92; H01L 27/0805; H01L 21/32135
See application file for complete search history.

(56) References Cited

U.S. PATENT DOCUMENTS 6,201,276 B1 * 3/2001 Agarwal ................. H01L 28/56
257/315
8,399,344 B2 3/2013 Pierreux et al.
(Continued)

FOREIGN PATENT DOCUMENTS

KR 10-0709578 4/2007

OTHER PUBLICATIONS

Robison, Simulation of Fluorine Diffusion Behavior and Boron-Fluorine Co-Interaction in Silicon University of Florida 2006, available at http://etd.fcla.edu/UF/UFE0013790/robison_r.pdf (Year: 2006).*

*Primary Examiner* — Bradley Smith
*Assistant Examiner* — Tenley H Schofield
(74) *Attorney, Agent, or Firm* — Myers Bigel, P.A.

(57) ABSTRACT

A semiconductor device includes a landing pad on a substrate, a lower electrode on the landing pad, the lower electrode being electrically connected to the landing pad, a dielectric layer on the lower electrode, the dielectric layer extending along a profile of the lower electrode, an upper electrode on the dielectric layer, and an upper plate electrode on the upper electrode and including first fluorine (F) therein, wherein the upper plate electrode includes an interface facing the upper electrode, and wherein the upper plate electrode includes a portion in which a concentration of the first fluorine decreases as a distance from the interface of the upper plate electrode increases.

18 Claims, 21 Drawing Sheets

(51) Int. Cl.
    *H01L 21/768*     (2006.01)
    *H01L 23/00*     (2006.01)
    *H01L 23/31*     (2006.01)
    *H01L 27/108*     (2006.01)

(56) References Cited

U.S. PATENT DOCUMENTS

| | | | |
|---|---|---|---|
| 8,865,544 | B2 | 10/2014 | Greeley et al. |
| 8,987,046 | B2 * | 3/2015 | Sekar .................. H01L 45/08 |
| | | | 257/43 |
| 9,159,729 | B2 | 10/2015 | Kim et al. |
| 9,202,815 | B1 * | 12/2015 | Kaemmer ............. H01L 29/513 |
| 9,263,536 | B2 | 2/2016 | Kim et al. |
| 9,496,328 | B2 | 11/2016 | Seo et al. |
| 9,673,272 | B2 | 6/2017 | Choi et al. |
| 9,799,658 | B2 | 10/2017 | Lugani et al. |
| 2001/0002071 | A1 * | 5/2001 | Agarwal ........... H01L 21/28088 |
| | | | 257/751 |
| 2006/0267019 | A1 * | 11/2006 | Kim ................. H01L 28/75 |
| | | | 257/68 |
| 2008/0297982 | A1 * | 12/2008 | Umemoto ............... H01G 9/07 |
| | | | 29/25.03 |
| 2010/0315760 | A1 * | 12/2010 | Krishnan ................ H01G 4/10 |
| | | | 361/313 |
| 2015/0270271 | A1 * | 9/2015 | Sakamoto ........... H01L 21/3212 |
| | | | 257/306 |
| 2016/0079256 | A1 * | 3/2016 | Inaba ................. H01L 29/4234 |
| | | | 257/324 |
| 2016/0276217 | A1 * | 9/2016 | Engel ................ H01L 21/28568 |
| 2017/0077102 | A1 * | 3/2017 | Kim ................. H01L 27/10876 |
| 2017/0330743 | A1 * | 11/2017 | Chalker ............. H01L 21/0228 |
| 2019/0165087 | A1 | 5/2019 | Kim et al. |

* cited by examiner

SEMICONDUCTOR DEVICE ELECTRODES INCLUDING FLUORINE

CROSS-REFERENCE TO RELATED APPLICATION

This application claims priority from Korean Patent Application No. 10-2019-0135044 filed on Oct. 29, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same, and more particularly, to a semiconductor device using a capacitor as a data storage element and a method for fabricating the same.

2. Description of the Related Art

Recently, as semiconductor devices with larger storage capacity have been highly integrated, the design rule has continuously decreased. This trend can also be seen in a dynamic random access memory (DRAM), which is one type of semiconductor memory devices. In order for a DRAM to operate, more than a certain level of capacitance is required in each cell.

An increase in capacitance may increase the amount of charge stored in a capacitor, thereby improving refresh characteristics of a semiconductor device. The improved refresh characteristics of the semiconductor device can improve the yield of the semiconductor device.

In order to increase the capacitance, a method of utilizing a dielectric layer having a high dielectric constant in a capacitor or increasing the contact area between the lower electrode of the capacitor and the dielectric layer has been studied.

SUMMARY

Aspects of the present disclosure provide a semiconductor device with improved performance and reliability through interfacial engineering between a plate electrode and an upper electrode.

Aspects of the present disclosure also provide a method for fabricating a semiconductor device with improved performance and reliability through interfacial engineering between a plate electrode and an upper electrode.

According to an example embodiment of the present inventive concept, a semiconductor device includes a landing pad on a substrate, a lower electrode on the landing pad, the lower electrode being electrically connected to the landing pad, a dielectric layer on the lower electrode, the dielectric layer extending along a profile of the lower electrode, an upper electrode on the dielectric layer, and an upper plate electrode on the upper electrode and including first fluorine (F) therein, wherein the upper plate electrode includes an interface facing the upper electrode, and wherein the upper plate electrode includes a portion in which a concentration of the first fluorine decreases as a distance from the interface of the upper plate electrode increases.

According to an example embodiment of the present inventive concept, A semiconductor device includes a landing pad on a substrate, a lower electrode on the landing pad, the lower electrode being electrically connected to the landing pad, a dielectric layer on the lower electrode, the dielectric layer extending along a profile of the lower electrode, an upper electrode on the dielectric layer, and an upper plate electrode including a lower plate region on the upper electrode and an upper plate region, wherein the lower plate region is between the upper electrode and the upper plate region, and wherein the lower plate region includes fluorine therein and the upper plate region does not include fluorine.

According to an example embodiment of the present inventive concept, a semiconductor device includes a trench in a substrate, a gate electrode filling a portion of the trench, a buried contact on at least one side of the gate electrode and electrically connected to the substrate, a landing pad on the buried contact, and a capacitor electrically connected to the landing pad, wherein the capacitor includes a lower electrode electrically connected to the landing pad, a dielectric layer on the lower electrode, an upper electrode on the dielectric layer, and an upper plate electrode on the upper electrode, wherein the upper plate electrode includes fluorine, and wherein the upper plate electrode includes a portion in which a concentration of the fluorine decreases as a distance from the upper electrode increases.

A method for fabricating a semiconductor device, the method includes forming a lower electrode on a landing pad, forming, on the lower electrode, a dielectric layer along a profile of the lower electrode, forming an upper electrode on the dielectric layer, and forming, on the upper electrode, an upper plate electrode doped with fluorine.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
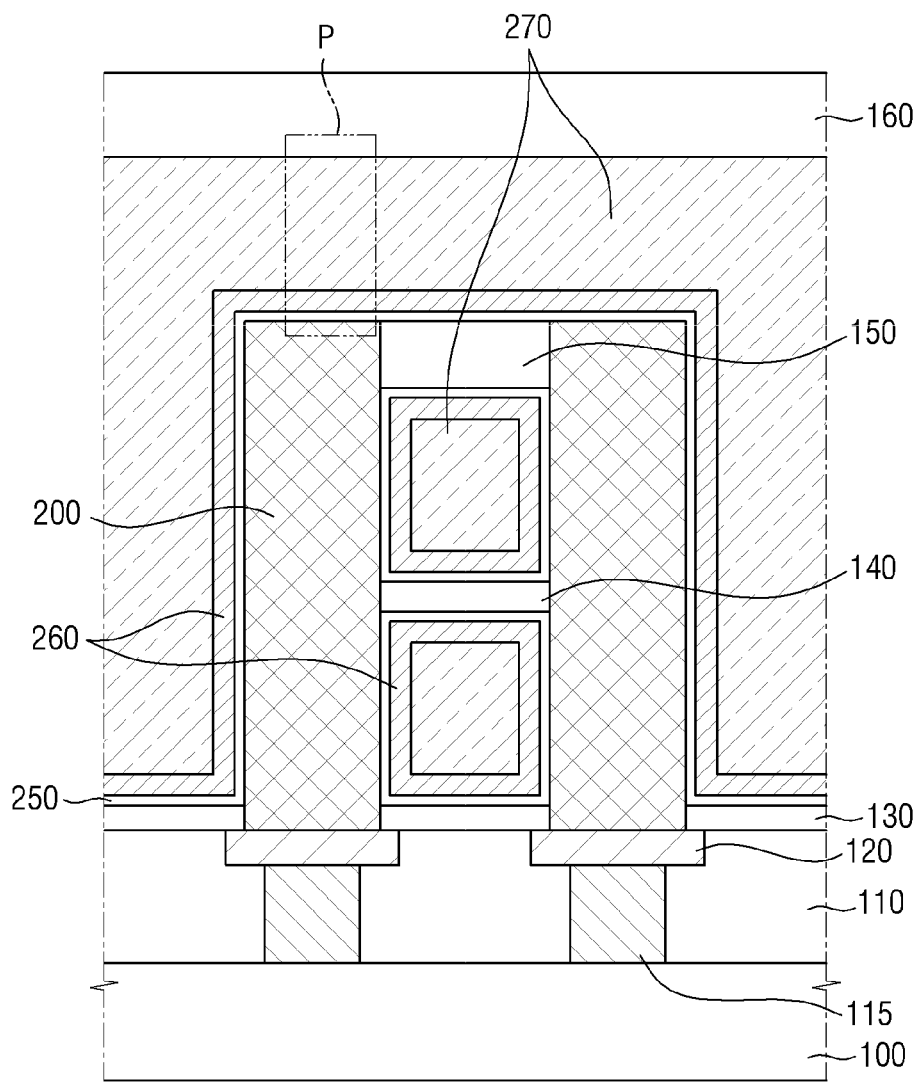
FIG. 1 is a diagram illustrating a semiconductor device according to some embodiments.
Figure 1:
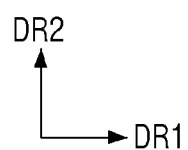
Figure 2:
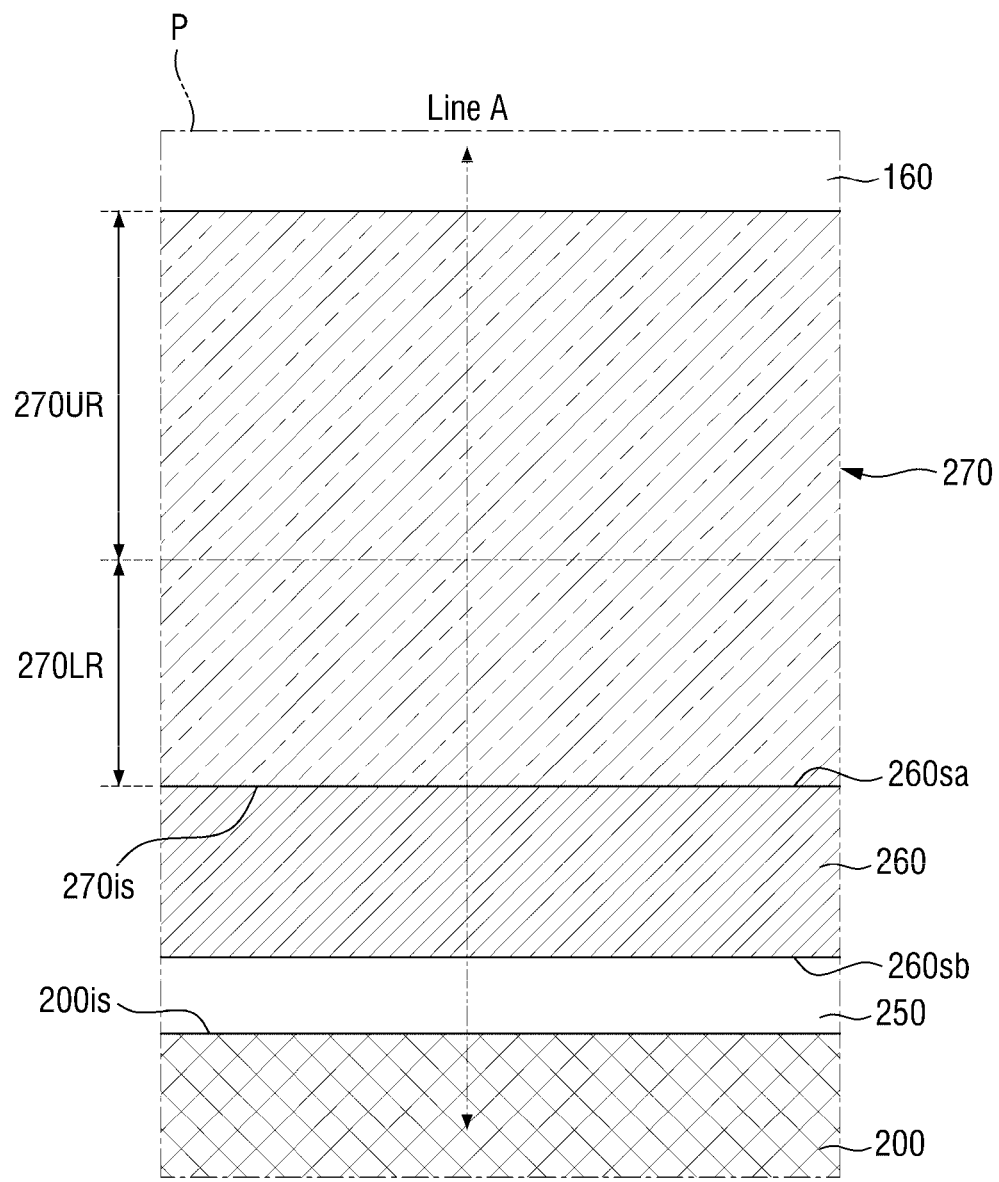
FIG. 2 is an enlarged view of portion P of FIG. 1.
Figure 3:
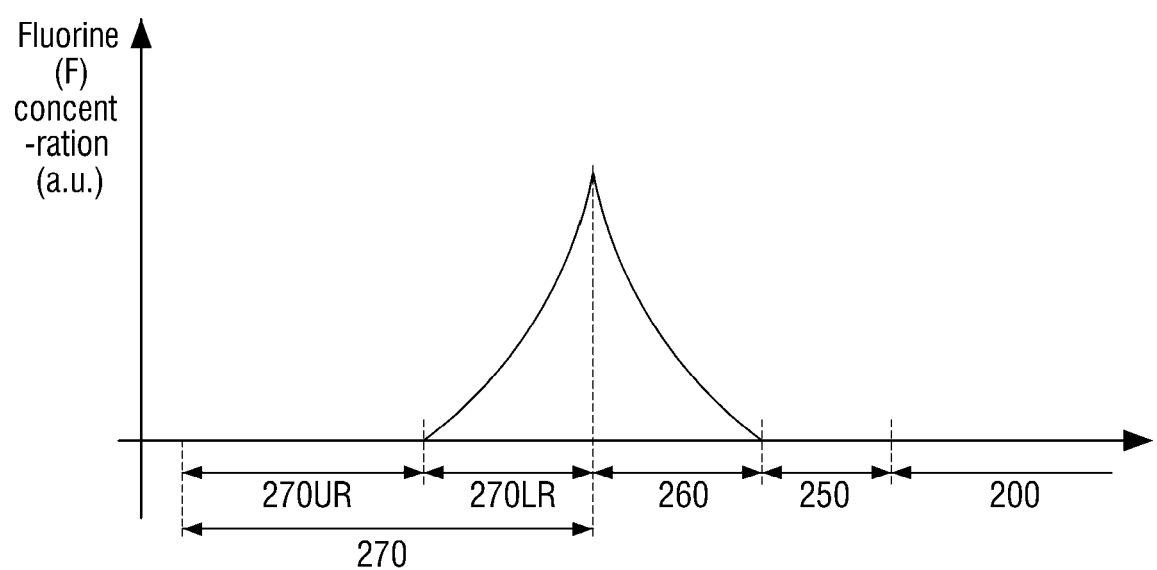
FIGS. 3 to 6 are schematic graphs showing different examples of the concentration of fluorine (F) along line A of FIG. 2.

FIG. 1 is a diagram illustrating a semiconductor device according to some embodiments. FIG. 2 is an enlarged view of portion P of FIG. 1. FIG. 3 is a schematic graph showing the concentration of fluorine (F) along line A of FIG. 2.

Referring to FIGS. 1 to 3, a semiconductor device according to some embodiments may include a first landing pad 120, a lower electrode 200, a capacitor dielectric layer 250, an upper electrode 260 and an upper plate electrode 270.

The first landing pad 120 may be disposed on a substrate 100. The first landing pad 120 may be connected to the substrate 100. The first landing pad 120 may be electrically connected to a conductive region formed on or in the substrate 100.

The first landing pad 120 may be connected to the substrate 100 through a first storage contact 115. The first landing pad 120 may be disposed on the first storage contact 115.

A first interlayer insulating layer 110 may be disposed on the substrate 100. The first storage contact 115 and the first landing pad 120 may be disposed in the first interlayer insulating layer 110 on the substrate 100.

The substrate 100 may be a bulk silicon or silicon-on-insulator (SOI) substrate. Alternatively, the substrate 100 may be a silicon substrate or may include other materials such as silicon germanium, silicon germanium on insulator (SGOI), indium antimonide, a lead tellurium compound, indium arsenide, indium phosphide, gallium arsenide, or gallium antimonide, but the present disclosure is not limited thereto. In the following description, it is assumed that the substrate 100 is a silicon substrate.

The first interlayer insulating layer 110 may include, for example, at least one of silicon oxide, silicon nitride, silicon oxynitride (SiON), silicon oxycarbonitride (SiOCN), or a combination thereof.

The first storage contact 115 may include, for example, at least one of a semiconductor material doped with impurities, a conductive silicide compound, conductive metal nitride, or metal.

The first landing pad 120 may include, for example, at least one of a semiconductor material doped with impurities, a conductive silicide compound, conductive metal nitride, or metal.

In the semiconductor device according to some embodiments, the first landing pad 120 may include tungsten (W).

An etch stop layer 130 may be disposed on the first interlayer insulating layer 110. The etch stop layer 130 may expose at least a portion of the first landing pad 120.

For example, the etch stop layer 130 may be disposed on the first landing pad 120. The etch stop layer 130 may include a lower electrode hole exposing at least a portion of the first landing pad 120.

The etch stop layer 130 may include, for example, at least one of silicon nitride (SiN), silicon carbonitride (SiCN), silicon boron nitride (SiBN), silicon oxycarbide (SiCO), silicon oxynitride (SiON), silicon oxide (SiO), or silicon oxycarbonitride (SiOCN). For example, the term "silicon oxycarbide (SiCO)" refers to containing silicon (Si), carbon (C) and oxygen (O), but does not refer to a ratio between silicon (Si), carbon (C) and oxygen (O).

The lower electrode 200 may be disposed on the first landing pad 120. The lower electrode 200 is electrically connected to the first landing pad 120.

The lower electrode 200 may extend in a second direction DR2 that is a thickness direction of the substrate 100. The length of the lower electrode 200 extending in the second direction DR2 is greater than the length of the lower electrode 200 extending in a first direction DR1.

Alternatively, the length of the lower electrode 200 extending in the second direction DR2 is greater than the width of the lower electrode 200 in the first direction DR1. The lower electrode 200 may have a pillar (e.g., rectangular) shape, for example.

Here, the second direction DR2 may refer to a direction parallel to the thickness direction of the substrate 100. The first direction DR1 crossing the second direction DR2 refers to a direction parallel to the top surface of the substrate 100 or the top surface of the first interlayer insulating layer 110.

A portion of the lower electrode 200 may be disposed in the etch stop layer 130. The lower electrode 200 may pass through the etch stop layer 130 to be electrically connected to the first landing pad 120. For example, a portion of the sidewall of the lower electrode 200 may be in contact with the etch stop layer 130.

The lower electrode 200 may include, for example, a doped semiconductor material, conductive metal nitride (e.g., titanium nitride, tantalum nitride, niobium nitride, or tungsten nitride), metal (e.g., ruthenium, iridium, titanium or tantalum), conductive metal oxide (e.g., iridium oxide or niobium oxide) or the like, but the present disclosure is not limited thereto. In the semiconductor device according to some embodiments, the lower electrode 200 may include titanium nitride (TiN). In addition, in the semiconductor device according to some embodiments, the lower electrode 200 may include niobium nitride (NbN).

A lower supporter pattern 140 may be disposed on the etch stop layer 130. The lower supporter pattern 140 is spaced apart from the etch stop layer 130 in the second direction DR2.

The lower supporter pattern 140 may be in contact with the lower electrode 200. The lower supporter pattern 140 may be in contact with a portion of the sidewall of the lower electrode 200.

The lower supporter pattern 140 may connect ones of the lower electrodes 200 that are adjacent in the first direction DR1. Although FIG. 1 illustrates that two lower electrodes 200 are connected by the lower supporter pattern 140, it is merely for convenience of description and the present disclosure is not limited thereto.

An upper supporter pattern 150 may be disposed on the lower supporter pattern 140. The upper supporter pattern 150 is spaced apart from the lower supporter pattern 140 in the second direction DR2.

The upper supporter pattern 150 may be in contact with the lower electrode 200. The upper supporter pattern 150 may be in contact with a portion of the sidewall of the lower electrode 200. Although FIG. 1 illustrates that two lower electrodes 200 are connected by the upper supporter pattern 150, it is merely for convenience of description and the present disclosure is not limited thereto.

For example, as illustrated, the top surface of the upper supporter pattern 150 may be flush (i.e., coplanar) with the top surface of the lower electrode 200. As another example, the top surface of the lower electrode 200 may protrude beyond the top surface of the upper supporter pattern 150 in the second direction DR2 away from the substrate 100. In the following description, it is assumed that the top surface of the upper supporter pattern 150 is flush with the top surface of the lower electrode 200.

Each of the lower supporter pattern 140 and the upper supporter pattern 150 may include, for example, at least one of silicon nitride (SiN), silicon carbonitride (SiCN), silicon boron nitride (SiBN), silicon oxycarbide (SiCO), silicon oxynitride (SiON), silicon oxide (SiO), or silicon oxycarbonitride (SiOCN). In the semiconductor device according to some embodiments, each of the lower supporter pattern 140 and the upper supporter pattern 150 may include silicon carbonitride (SiCN) or silicon nitride.

Although FIG. 1 illustrates that the thickness of the lower supporter pattern 140 in the second direction DR2 is smaller than the thickness of the upper supporter pattern 150 in the second direction DR2, the present disclosure is not limited thereto. The thickness of the lower supporter pattern 140 in the second direction DR2 may be the same as the thickness of the upper supporter pattern 150 in the second direction DR2.

Unlike the illustrated example, the semiconductor device according to some embodiments may include only one of the lower supporter pattern 140 and the upper supporter pattern 150. Alternatively, in the semiconductor device according to some embodiments, an additional supporter pattern may be disposed between the etch stop layer 130 and the lower supporter pattern 140, or between the lower supporter pattern 140 and the upper supporter pattern 150.

The capacitor dielectric layer 250 may be disposed on the lower electrode 200. The capacitor dielectric layer 250 may be formed on an interface 200is of the lower electrode 200. The interface 200is of the lower electrode 200 may be one surface of the lower electrode 200 facing the capacitor dielectric layer 250. The interface 200is of the lower electrode 200 may be a portion of the surface defining an outer shape of the lower electrode 200, which faces the capacitor dielectric layer 250.

The capacitor dielectric layer 250 may be formed along the surface of the lower electrode 200, the surface of the lower supporter pattern 140, the surface of the upper supporter pattern 150, and the top surface of the etch stop layer 130. The capacitor dielectric layer 250 may extend along the profile of (e.g., extend conformally on) the lower electrode 200, the upper supporter pattern 150, the lower supporter pattern 140 and the etch stop layer 130.

Since the lower supporter pattern 140 and the upper supporter pattern 150 are in contact with the lower electrode 200, the capacitor dielectric layer 250 does not extend between the lower supporter pattern 140 and the lower electrode 200 and does not extend between the upper supporter pattern 150 and the lower electrode 200. In addition, the capacitor dielectric layer 250 does not extend between the etch stop layer 130 and the lower electrode 200.

The capacitor dielectric layer 250 may include, for example, one selected from the group consisting of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof, but is not limited thereto. Although it is illustrated that the capacitor dielectric layer 250 is a single layer, it is merely for convenience of description and the present disclosure is not limited thereto.

In the semiconductor device according to some embodiments, the capacitor dielectric layer 250 may include a stacked structure in which zirconium oxide, aluminum oxide and zirconium oxide are sequentially stacked.

In the semiconductor device according to some embodiments, the capacitor dielectric layer 250 may include a dielectric layer including hafnium (Hf).

In the semiconductor device according to some embodiments, the capacitor dielectric layer 250 may have a stacked structure including a ferroelectric material layer and a paraelectric material layer.

The ferroelectric material layer may have ferroelectric properties. The ferroelectric material layer may have a sufficient thickness to have ferroelectric properties. The thickness range of the ferroelectric material layer having ferroelectric properties may vary depending on the ferroelectric material.

For example, the ferroelectric material layer may include monometal oxide. The ferroelectric material layer may include a monometal oxide layer. Here, the monometal oxide may be a binary compound composed of one metal and oxygen. The ferroelectric material layer including monometal oxide may have an orthorhombic crystal system.

As an example, the metal included in the monometal oxide layer may be hafnium (Hf). The monometal oxide layer may be a hafnium oxide (HfO) layer. Here, the hafnium oxide layer may have a chemical formula that conforms to stoichiometry, or may have a chemical formula that does not conform to stoichiometry.

As another example, the metal included in the monometal oxide layer may be one of various rare earth metals belonging to lanthanoids. The monometal oxide layer may be a rare earth metal oxide layer formed from a rare earth metal belonging to lanthanoids. Here, the rare earth metal (belonging to lanthanoids) oxide layer may have a chemical formula that conforms to stoichiometry, or may have a chemical formula that does not conform to stoichiometry.

The ferroelectric material layer may further include a dopant doped into the monometal oxide layer. The doping concentration may vary depending on the type of dopant, but the doping concentration of the dopant included in the ferroelectric material layer may be 10% or less.

As an example, when the monometal oxide layer is a hafnium oxide layer, the dopant may include at least one of gadolinium (Gd), silicon (Si), aluminum (Al), yttrium (Y), lanthanum (La), scandium (Sc), cerium (Ce), dysprosium (Dy), tantalum (Ta), strontium (Sr), or niobium (Nb). As another example, when the monometal oxide layer is a rare earth metal (belonging to lanthanoids) oxide layer, the dopant may include at least one of silicon (Si), aluminum (Al), hafnium (Hf), zirconium (Zr), or niobium (Nb).

As another example, the ferroelectric material layer may not include a dopant doped into the monometal oxide layer.

When the ferroelectric material layer includes a monometal oxide layer, the ferroelectric material layer may have a thickness of, for example, 1 nanometer (nm) or more and 10 nm or less.

For example, the ferroelectric material layer may include bimetal oxide. The ferroelectric material layer may include a bimetal oxide layer. Here, the bimetal oxide may be a ternary compound composed of two metals and oxygen. The ferroelectric material layer including bimetal oxide may have an orthorhombic crystal system.

The metals included in the bimetal oxide layer may be, for example, hafnium (Hf) and zirconium (Zr). The bimetal oxide layer may be a hafnium zirconium oxide layer ($Hf_xZr_{(1-x)}O$). In the bimetal oxide layer, x may be 0.2 or more and 0.8 or less. Here, the hafnium zirconium oxide layer ($Hf_xZr_{(1-x)}O$) may have a chemical formula that conforms to stoichiometry, or may have a chemical formula that does not conform to stoichiometry.

As an example, the ferroelectric material layer may further include a dopant doped into the bimetal oxide layer. The dopant may include at least one of gadolinium (Gd), silicon (Si), aluminum (Al), yttrium (Y), lanthanum (La), scandium (Sc), cerium (Ce), dysprosium (Dy), tantalum (Ta), or strontium (Sr). As another example, the ferroelectric material layer may not include a dopant doped into the bimetal oxide layer.

When the ferroelectric material layer includes a bimetal oxide layer, the ferroelectric material layer may have a thickness of, for example, 1 nm or more and 20 nm or less.

For example, the paraelectric material layer may be a dielectric layer including zirconium (Zr) or a stack layer including zirconium (Zr), but is not limited thereto. Although it has the same chemical formula, it may exhibit ferroelectric properties or exhibit paraelectric properties depending on the crystal structure of the dielectric material.

The paraelectric material may have a positive dielectric constant, and the ferroelectric material may have a negative dielectric constant within a predetermined range. That is, the paraelectric material may have a positive capacitance, and the ferroelectric material may have a negative capacitance.

Generally, when two or more capacitors having a positive capacitance are connected in series, the sum of the capacitances decreases. However, when a negative capacitor having a negative capacitance and a positive capacitor having a positive capacitance are connected in series, the sum of the capacitances increases.

The upper electrode 260 may be disposed on the capacitor dielectric layer 250. The upper electrode 260 may extend along the profile of the capacitor dielectric layer 250.

The upper electrode 260 may include a first surface 260*sa* and a second surface 260*sb* opposing each other. The second surface 260*sb* of the upper electrode 260 may face the capacitor dielectric layer 250. The second surface 260*sb* of the upper electrode 260 may be a surface facing the capacitor dielectric layer 250.

The upper electrode 260 may include, for example, a doped semiconductor material, conductive metal nitride (e.g., titanium nitride, tantalum nitride, niobium nitride, or tungsten nitride), metal (e.g., ruthenium, iridium, titanium or tantalum), conductive metal oxide (e.g., iridium oxide or niobium oxide) or the like, but the present disclosure is not limited thereto. In the semiconductor device according to some embodiments, the upper electrode 260 may include titanium nitride (TiN). In addition, in the semiconductor device according to some embodiments, the upper electrode 260 may include niobium nitride (NbN).

The upper electrode 260 may include doped fluorine (F). A detailed description thereof will be given in the description of the upper plate electrode 270.

The upper plate electrode 270 may be disposed on the upper electrode 260. The upper plate electrode 270 may be disposed on the first surface 260*sa* of the upper electrode 260.

The upper plate electrode 270 includes an interface 270*is* facing the first surface 260*sa* of the upper electrode 260. The interface 270*is* of the upper plate electrode 270 may be defined along the profile of the upper electrode 260.

The upper plate electrode 270 may include, for example, at least one of an element semiconductor material layer or a compound semiconductor material layer. The upper plate electrode 270 may include doped n-type impurities or p-type impurities.

The element semiconductor material layer may include, for example, a silicon layer or a germanium layer. The compound semiconductor material layer may include, for example, a silicon germanium layer. In the semiconductor device according to some embodiments, the upper plate electrode 270 may include a silicon germanium layer.

The upper plate electrode 270 may include doped fluorine (F) (i.e., F dopants). The upper plate electrode 270 may include a lower plate region 270LR including doped fluorine (F) and an upper plate region 270UR not containing doped fluorine. The lower plate region 270LR may be defined between the upper electrode 260 and the upper plate region 270UR.

A region of the upper plate electrode 270 including doped fluorine (F) is defined as the lower plate region 270LR. A region of the upper plate electrode 270 which does not include doped fluorine (F) is defined as the upper plate region 270UR. The lower plate region 270LR and the upper plate region 270UR may be distinguished according to whether doped fluorine (F) is included.

The upper plate electrode 270 may include a portion in which the concentration of doped fluorine (F) decreases as it goes away (i.e., with increased distance) from the interface 270*is* of the upper plate electrode 270. As it goes away from the interface 270*is* of the upper plate electrode, the concentration (/cm$^3$) of doped fluorine (F) in the lower plate region 270LR may decrease.

At a boundary portion of the upper plate electrode 270 including the interface 270*is* of the upper plate electrode 270, the concentration of doped fluorine (F) may be the largest. As it goes away from the boundary portion of the upper plate electrode 270, the concentration of doped fluorine (F) decreases.

As it goes away from the interface 270*is* of the upper plate electrode 270, the concentration of doped fluorine (F) included in the upper electrode 260 may decrease. As it goes from the first surface 260*sa* of the upper electrode 260 toward the second surface 260*sb* of the upper electrode, the concentration of doped fluorine (F) in the upper electrode 260 may decrease.

Although FIG. 3 illustrates that the doped fluorine (F) in the upper electrode 260 is distributed up to the second surface 260*sb* of the upper electrode, it is merely for convenience of description and the present disclosure is not limited thereto. The upper electrode 260 may include a first portion including doped fluorine (F) and a second portion not including doped fluorine (F).

Although FIG. 3 illustrates that the concentration of doped fluorine (F) is the highest at the interface 270*is* of the upper plate electrode 270, it is merely for convenience of description, and the present disclosure is not limited thereto. A portion having the highest concentration of doped fluorine (F) in the upper plate electrode 270 may be a region having an arbitrary thickness.

In FIG. 3, the concentration of fluorine (F) merely represents how large or small the concentration is for (e.g., within different portions of) each region. In FIG. 3, the concentration of fluorine (F) does not represent a quantified concentration value.

Portions of the upper plate electrode 270 that are disposed between the upper supporter pattern 150 and the lower supporter pattern 140 and/or between the lower supporter pattern 140 and the etch stop layer 130 may include the upper plate region 270UR, or may not include the upper plate region 270UR. This may depend on the extent to which the doped fluorine F is diffused in the upper plate electrode 270.

Unlike the illustrated example, the upper plate electrode 270 may not be formed between the upper supporter pattern 150 and the lower supporter pattern 140 and/or between the lower supporter pattern 140 and the etch stop layer 130.

The dielectric material included in the capacitor dielectric layer 250 may include metal oxide. If oxygen is released from the dielectric material and oxygen vacancy in the dielectric material increases, a breakdown voltage of the capacitor decreases. That is, when oxygen vacancy occurs in the metal oxide forming the capacitor dielectric layer 250, the breakdown voltage of the capacitor including the capacitor dielectric layer 250 may decrease.

However, by doping fluorine (F) into the portion of the upper plate electrode 270 forming a boundary with the upper electrode 260, the breakdown voltage of the capacitor including the capacitor dielectric layer 250 may be increased.

A second interlayer insulating layer 160 may be disposed on the upper plate electrode 270. The second interlayer insulating layer 160 may include, for example, at least one of silicon oxide, silicon nitride, silicon oxynitride (SiON), silicon oxycarbonitride (SiOCN), or a combination thereof.

Figure 4:
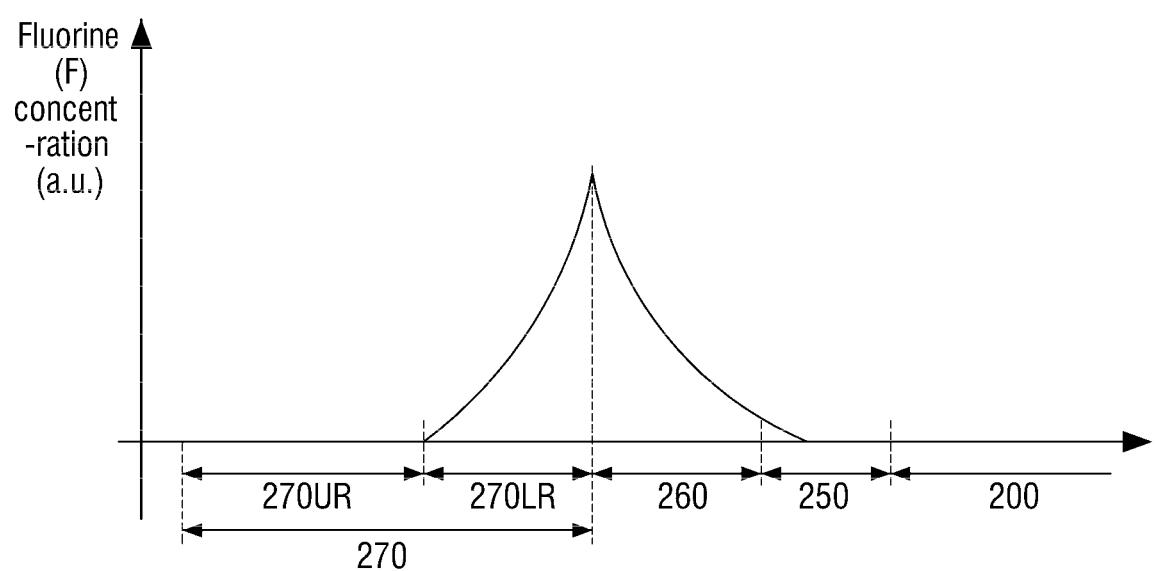
Figure 5:
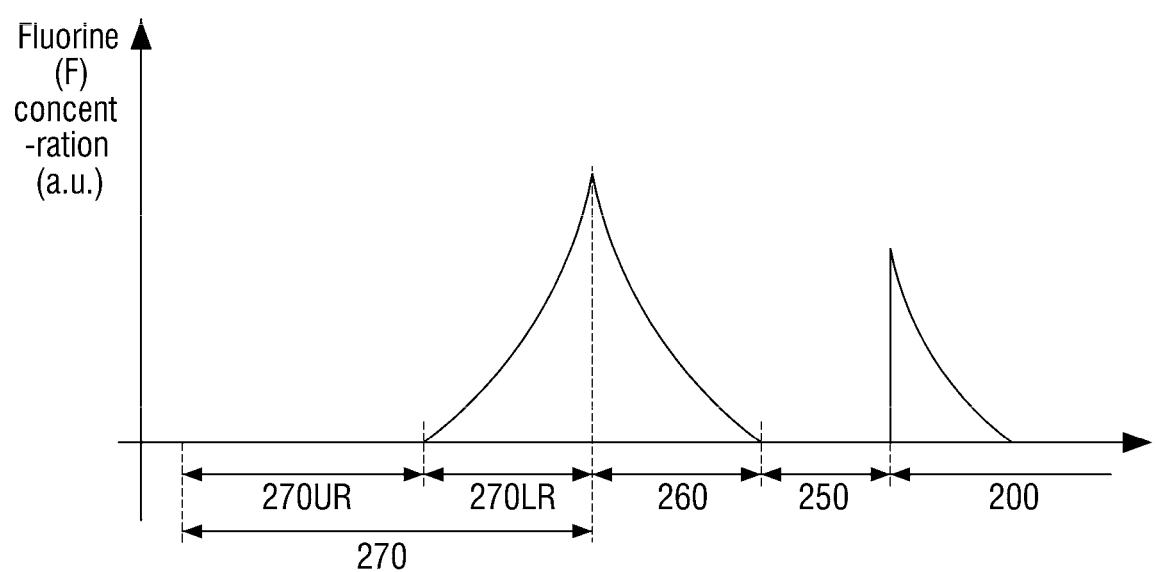
Figure 6:
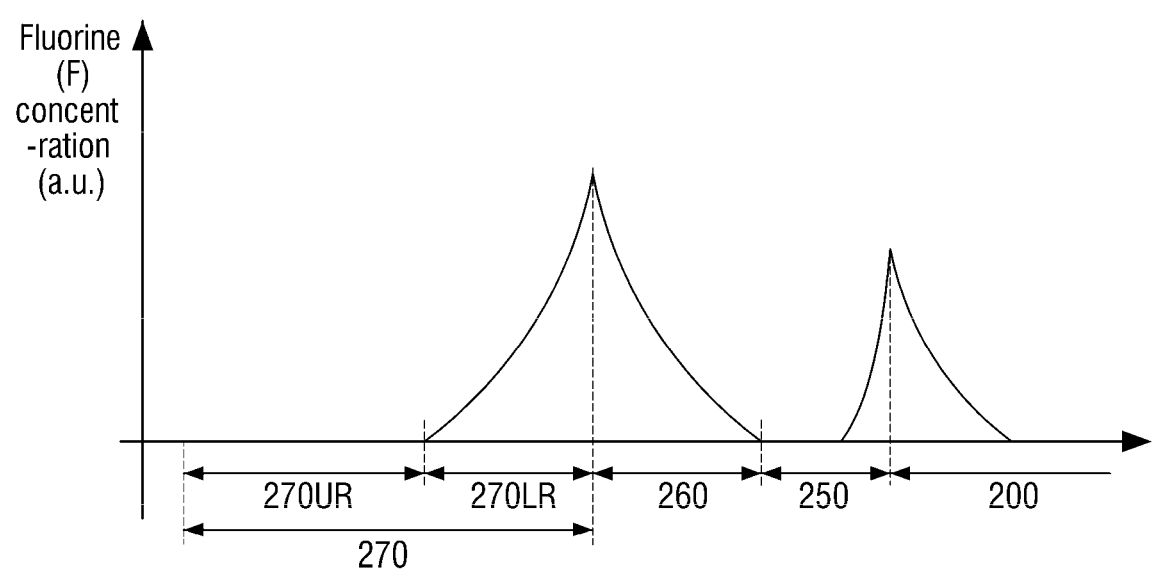

FIGS. 4 to 6 are schematic graphs showing different examples of the concentration of fluorine (F) along line A of FIG. 2 according to some embodiments. For simplicity of description, the following description will focus on differences from the description with reference to FIGS. 1 to 3.

Referring to FIG. 4, in the semiconductor device according to some embodiments, a portion of the capacitor dielectric layer 250 may include doped fluorine (F).

The doped fluorine (F) in the capacitor dielectric layer 250 is not distributed throughout the entirety of the capacitor dielectric layer 250.

The capacitor dielectric layer 250 may include a first region including doped fluorine (F) and a second region not including doped fluorine (F). The first region of the capacitor dielectric layer 250 may be adjacent to the upper electrode 260. On the interface 200is of the lower electrode 200, the second region of the capacitor dielectric layer 250 and the first region of the capacitor dielectric layer 250 may be sequentially defined.

Although FIG. 4 illustrates that doped fluorine (F) in the capacitor dielectric layer 250 gradually decreases as it goes away from the second surface 260sb of the upper electrode 260, it is merely for convenience of description, and the present disclosure is not limited thereto.

Referring to FIGS. 5 and 6, in the semiconductor device according to some embodiments, the lower electrode 200 may include doped fluorine (F). For example, the lower electrode 200 may include a second region of fluorine (F) that is spaced apart from a first region of fluorine (F) that is in the upper electrode 260 and the upper plate electrode 270.

As it goes away from the interface 200is of the lower electrode 200, the concentration of doped fluorine (F) included in the lower electrode 200 may decrease. At a boundary portion of the lower electrode 200 including the interface 200is of the lower electrode 200, the concentration of doped fluorine (F) may be the largest. For example, the concentration of doped fluorine (F) in the lower electrode 200 may be the highest at the interface 200is of the lower electrode 200.

In FIG. 5, the boundary portion of the capacitor dielectric layer 250 adjacent to the interface 200is of the lower electrode 200 does not include doped fluorine (F).

In FIG. 6, the capacitor dielectric layer 250 may include a third region including doped fluorine (F) and a second region not including doped fluorine (F). The third region of the capacitor dielectric layer 250 may be adjacent to the lower electrode 200. On the interface 200is of the lower electrode 200, the third region of the capacitor dielectric layer 250 and the second region of the capacitor dielectric layer 250 may be sequentially defined.

Although it has been illustrated that doped fluorine (F) in the capacitor dielectric layer 250 gradually decreases as it goes away from the interface 200is of the lower electrode 200, it is merely for convenience of description, and the present disclosure is not limited thereto.

Figure 7:
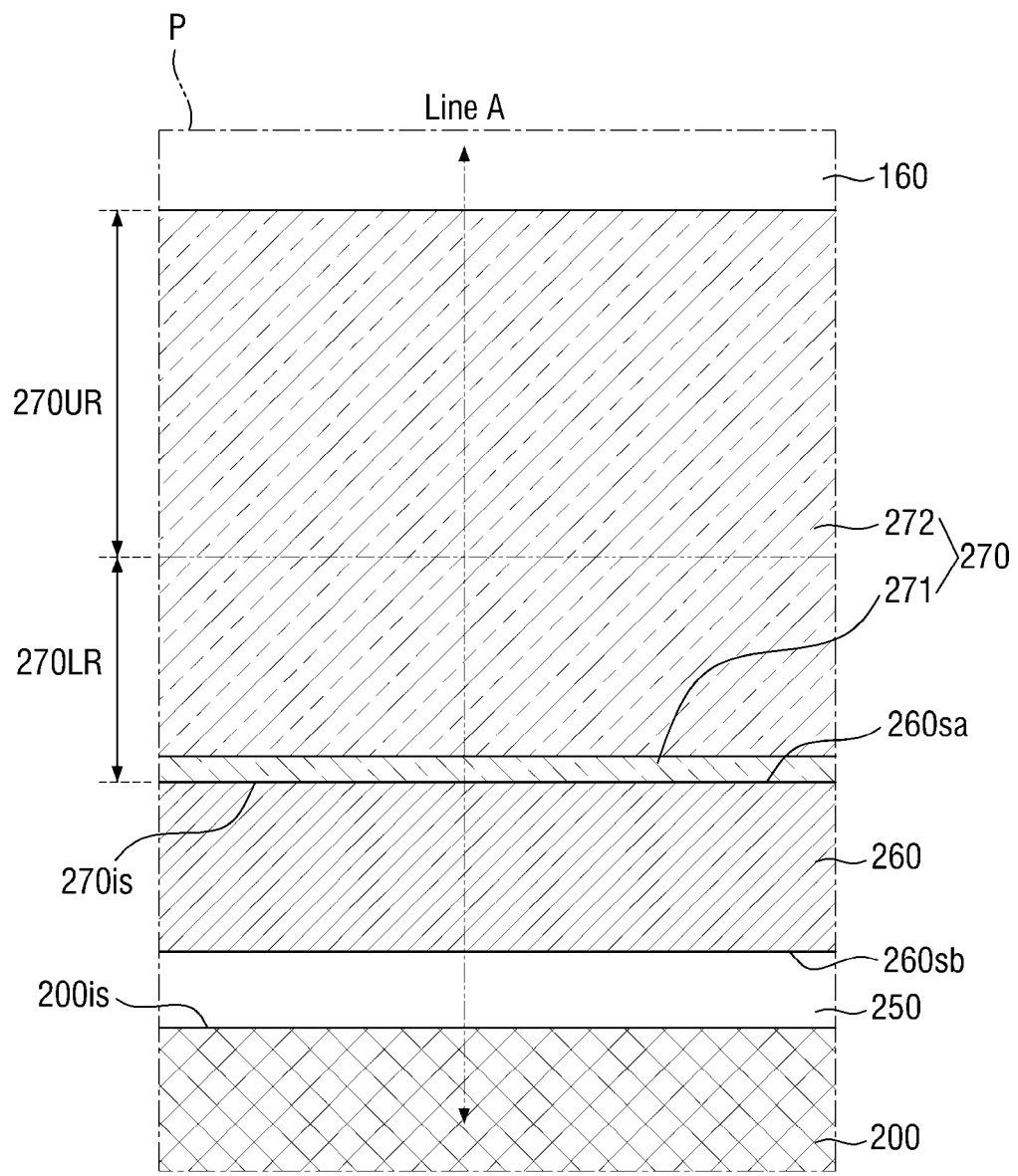
FIG. 7 is a diagram illustrating a semiconductor device according to some embodiments.

FIG. 7 is a diagram illustrating a semiconductor device according to some embodiments. For simplicity of description, the following description will focus on differences from the description with reference to FIGS. 1 to 3.

Figure 8:
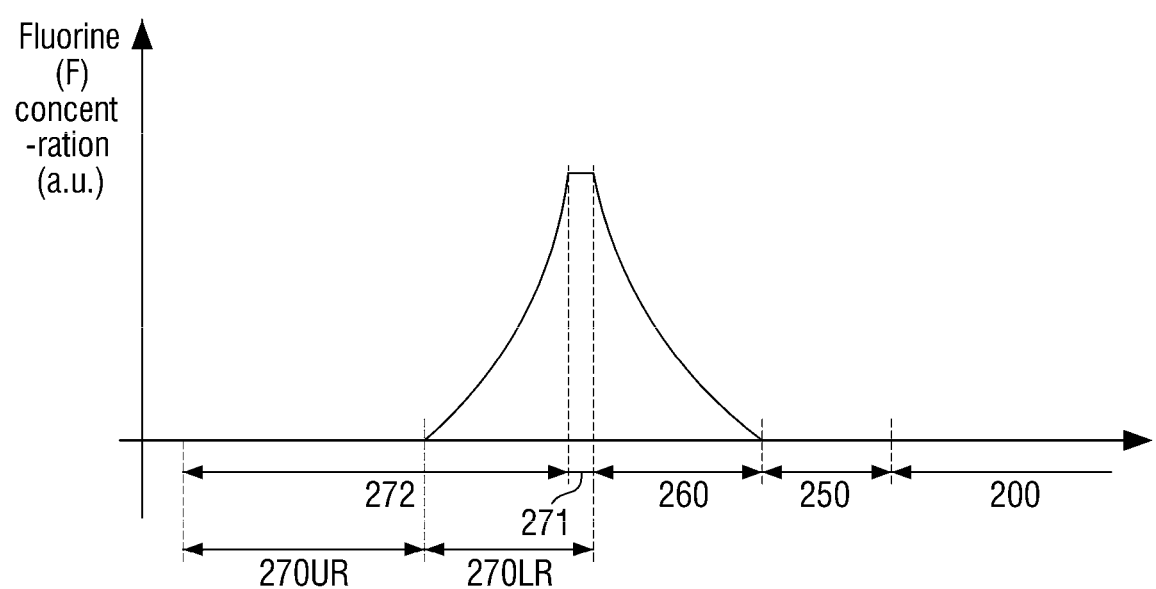
FIG. 8 is a schematic graph showing the concentration of fluorine (F) along line A of FIG. 7.

FIG. 8 is a schematic graph showing the concentration of fluorine (F) along line A of FIG. 7.

Referring to FIGS. 7 and 8, in the semiconductor device according to some embodiments, the upper plate electrode 270 may include a first plate electrode layer 271 and a second plate electrode layer 272.

The first plate electrode layer 271 may be disposed on the first surface 260sa of the upper electrode 260. The first plate electrode layer 271 includes the interface 270is of the upper plate electrode 270.

The second plate electrode layer 272 may be disposed on the first plate electrode layer 271. The first plate electrode layer 271 may be disposed between the upper electrode 260 and the second plate electrode layer 272.

The lower plate region 270LR may include the first plate electrode layer 271 and a portion of the second plate electrode layer 272. The upper plate region 270UR includes a portion of the second plate electrode layer 272, but does not include the first plate electrode layer 271.

Each of the first plate electrode layer 271 and the second plate electrode layer 272 may include a semiconductor material layer including p-type impurities or n-type impurities. In the semiconductor device according to some embodiments, the first plate electrode layer 271 may include an element semiconductor material layer. The second plate electrode layer 272 may include a compound semiconductor material layer. For example, the first plate electrode layer 271 may include a silicon layer, and the second plate electrode layer 272 may include a silicon germanium layer.

The concentration of doped fluorine (F) in the upper plate electrode 270 may be the highest in the first plate electrode layer 271. As it goes away from the first plate electrode layer 271, the concentration of doped fluorine (F) included in the second plate electrode layer 272 may decrease.

Figure 9:
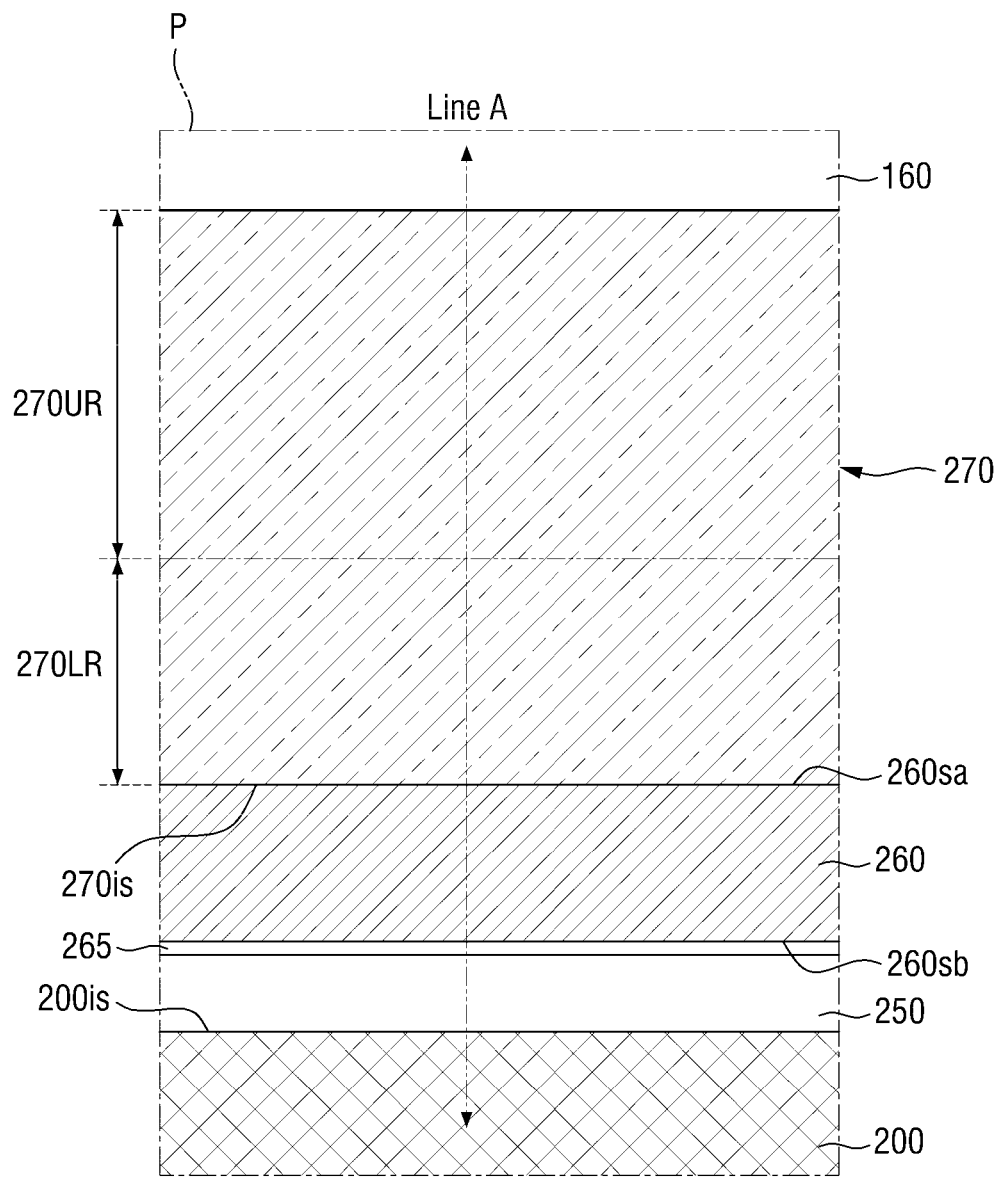
FIG. 9 is a diagram illustrating a semiconductor device according to some embodiments.

FIG. 9 is a diagram illustrating a semiconductor device according to some embodiments. For simplicity of description, the following description will focus on differences from the description with reference to FIGS. 1 to 3.

Figure 10:
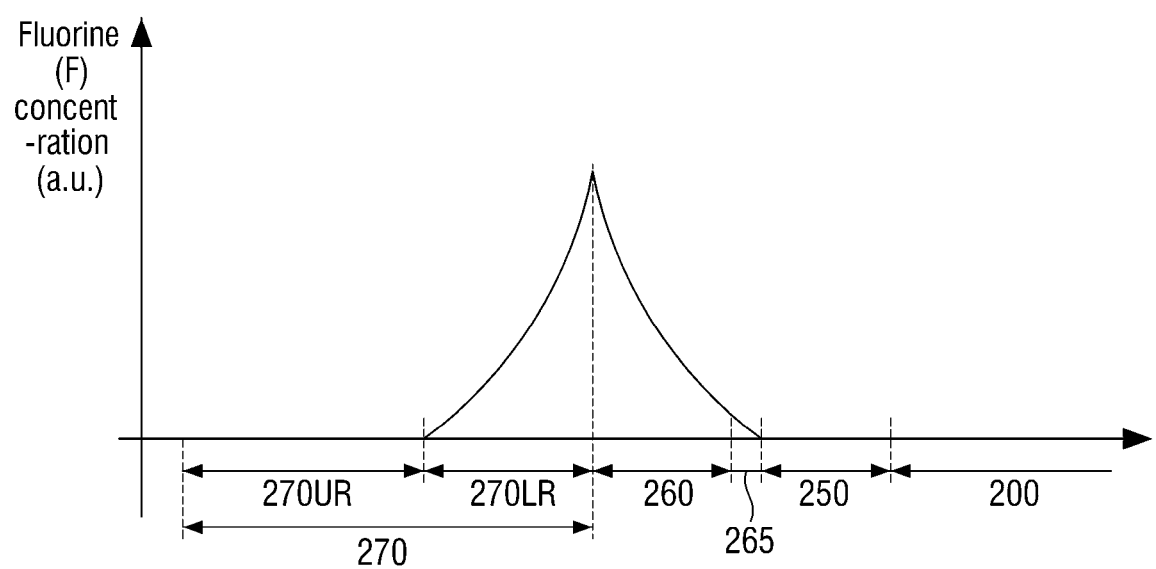
FIG. 10 is a schematic graph showing the concentration of fluorine (F) along line A of FIG. 9.

FIG. 10 is a schematic graph showing the concentration of fluorine (F) along line A of FIG. 9.

Referring to FIGS. 9 and 10, the semiconductor device according to some embodiments may further include an upper passivation layer 265 disposed between the capacitor dielectric layer 250 and the upper electrode 260.

The upper passivation layer 265 may impede/prevent oxygen atoms included in the capacitor dielectric layer 250 from moving to the upper electrode 260. The upper passivation layer 265 may be formed along the second surface 260sb of the upper electrode 260.

The upper passivation layer 265 may include metal oxide. The upper passivation layer 265 may include, for example, at least one of titanium oxide, tantalum oxide, molybdenum oxide, tin oxide, or niobium oxide.

The upper passivation layer 265 may include doped fluorine (F). Although it has been illustrated that the doped fluorine (F) in the upper passivation layer 265 is distributed up to a portion forming a boundary with the capacitor dielectric layer 250, it is merely for convenience of description, and the present disclosure is not limited thereto. The upper passivation layer 265 may include a first portion including doped fluorine (F) and a second portion not including doped fluorine (F).

Figure 11:
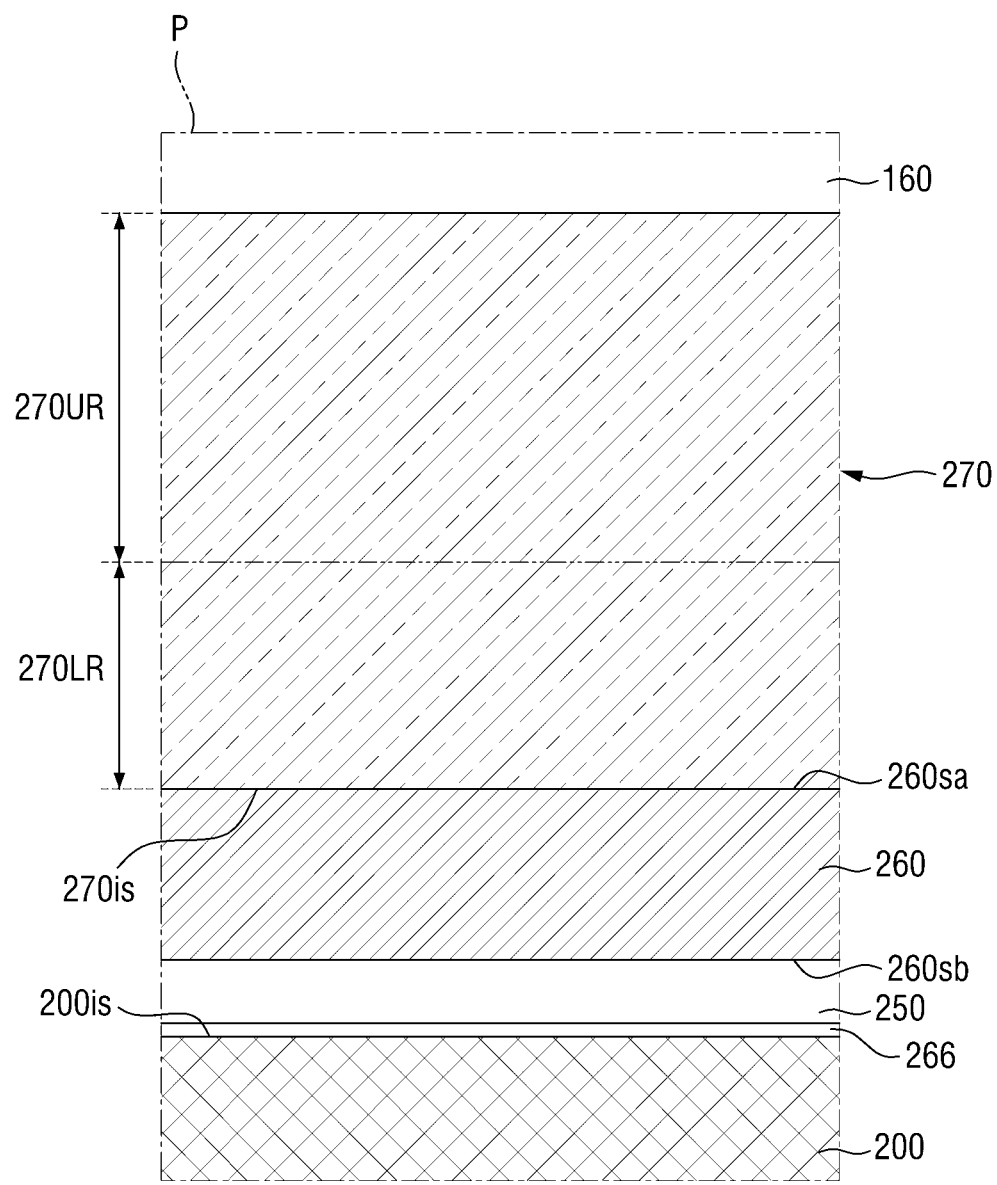
FIG. 11 is a diagram illustrating a semiconductor device according to some embodiments.
Figure 12:
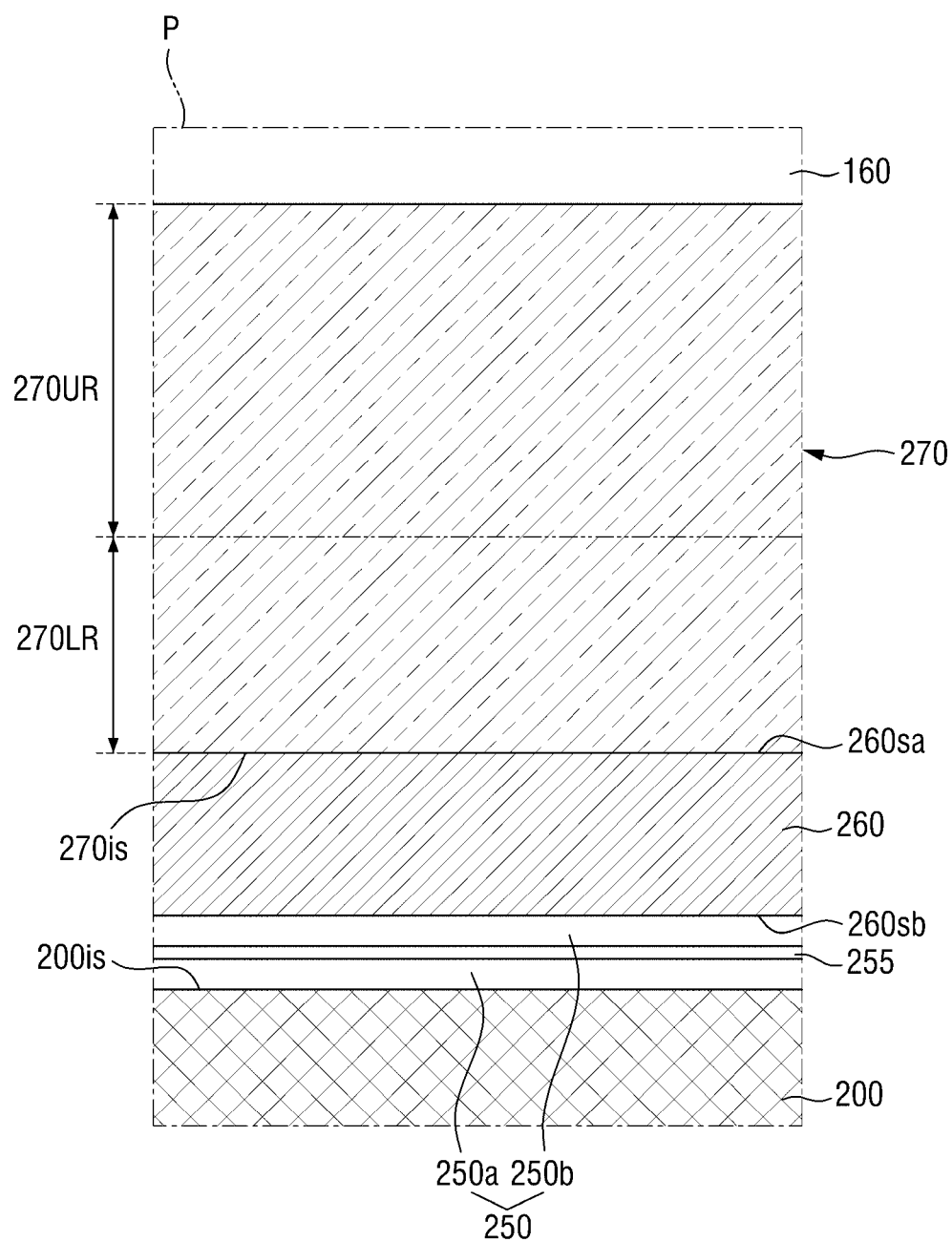
FIG. 12 is a diagram illustrating a semiconductor device according to some embodiments.

FIG. 11 is a diagram illustrating a semiconductor device according to some embodiments. FIG. 12 is a diagram illustrating a semiconductor device according to some embodiments. For simplicity of description, the following description will focus on differences from the description with reference to FIGS. 1 to 3.

Referring to FIG. 11, the semiconductor device according to some embodiments may further include a lower passivation layer 266 disposed between the capacitor dielectric layer 250 and the lower electrode 200.

The lower passivation layer 266 may impede/prevent oxygen atoms included in the capacitor dielectric layer 250 from moving to the lower electrode 200. The lower passivation layer 266 may be formed along the interface 200is of the lower electrode 200.

The lower passivation layer 266 may include metal oxide. The lower passivation layer 266 may include, for example, at least one of titanium oxide, tantalum oxide, molybdenum oxide, tin oxide, or niobium oxide.

Referring to FIG. 12, the semiconductor device according to some embodiments may further include an insertion layer 255 disposed between the lower electrode 200 and the upper electrode 260. The insertion layer 255 may be disposed in the capacitor dielectric layer 250.

The insertion layer 255 may promote crystallization of the capacitor dielectric layer 250. By the insertion layer 255, the capacitor dielectric layer 250 may be divided into a first portion 250a of the capacitor dielectric layer 250 and a second portion 250b of the capacitor dielectric layer 250. The insertion layer 255 may be in contact with the first portion 250a of the capacitor dielectric layer 250 and the second portion 250b of the capacitor dielectric layer 250.

The insertion layer 255 may include, for example, at least one of nitride or oxide of titanium (Ti), niobium (Nb), molybdenum (Mo), or tin (Sn). Alternatively, the insertion layer 255 may include at least one of ruthenium (Ru) or ruthenium oxide.

Figure 13:
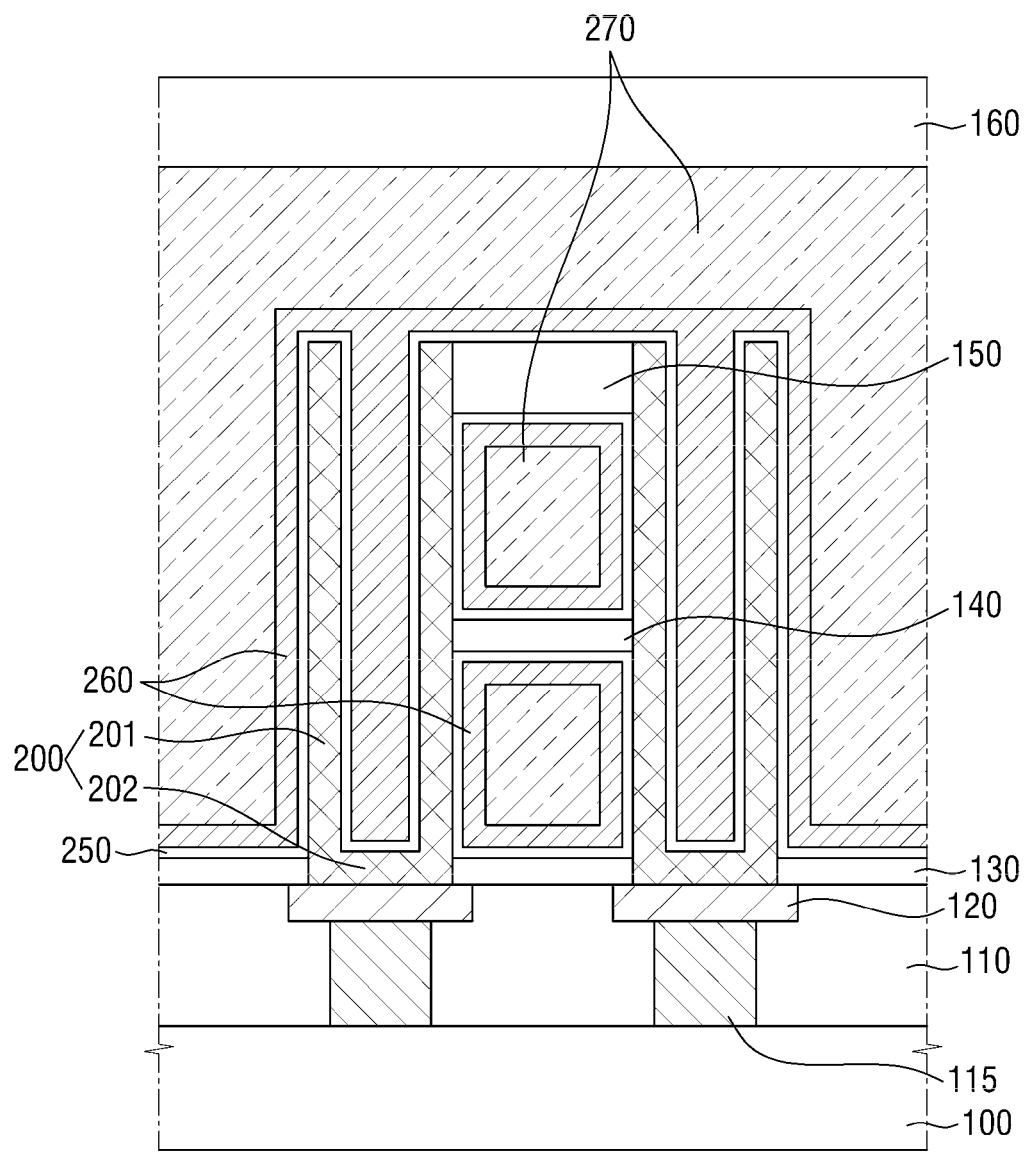
FIG. 13 is a diagram illustrating a semiconductor device according to some embodiments.
Figure 14:
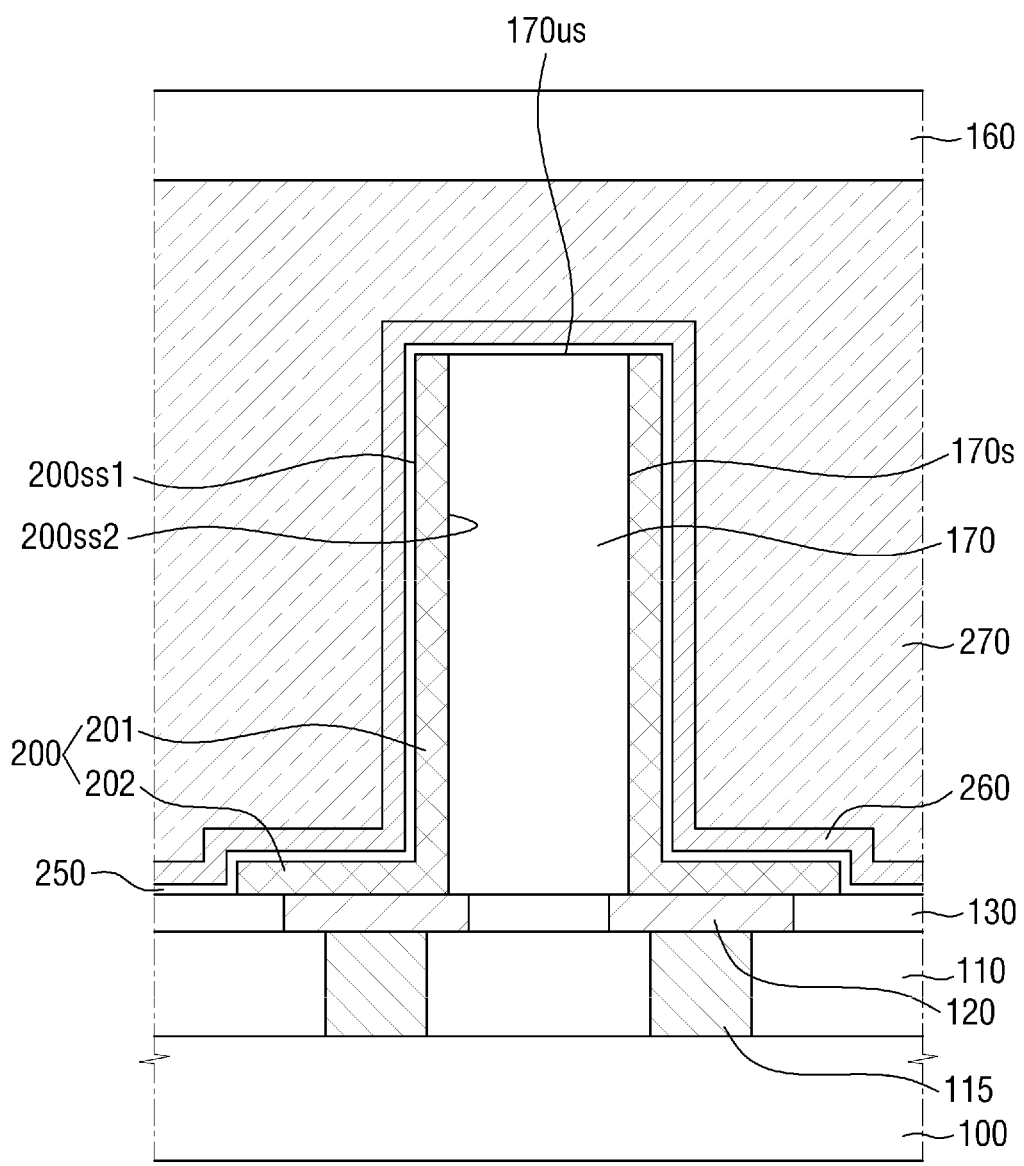
FIG. 14 is a diagram illustrating a semiconductor device according to some embodiments.

FIG. 13 is a diagram illustrating a semiconductor device according to some embodiments. FIG. 14 is a diagram illustrating a semiconductor device according to some embodiments. For simplicity of description, the following description will focus on differences from the description with reference to FIGS. 1 to 3.

Referring to FIG. 13, in the semiconductor device according to some embodiments, the lower electrode 200 may include a bottom portion 202 extending along the top surface of the first landing pad 120 and a sidewall portion 201 protruding from the bottom portion 202.

The bottom portion 202 of the lower electrode 200 may be parallel to the substrate 100. The sidewall portion 201 of the lower electrode 200 may extend in the second direction DR2.

The sidewall portion 201 of the lower electrode 200 may have a three-dimensional shape such as a barrel shape. The lower electrode 200 may have, for example, a cylindrical shape.

Referring to FIG. 14, the semiconductor device according to some embodiments may further include an insulating pattern 170 in contact with the lower electrode 200 and extending in the second direction DR2.

The insulating pattern 170 may be disposed on the etch stop layer 130. The insulating pattern 170 may include a sidewall 170s and an upper surface 170us.

The first landing pad 120 may be disposed in the etch stop layer 130. The lower electrode 200 may be disposed on the etch stop layer 130.

The lower electrode 200 may include the bottom portion 202 extending along the top surface of the first landing pad 120 and the sidewall portion 201 protruding from the bottom portion 202. The sidewall portion 201 of the lower electrode 200 may extend in the second direction DR2. The sidewall portion 201 of the lower electrode 200 may extend along the sidewall 170s of the insulating pattern 170.

The lower electrode 200 may include a first sidewall 200ss1 of the lower electrode 200 and a second sidewall 200ss2 of the lower electrode 200. The second sidewall 200ss2 of the lower electrode 200 may face the sidewall 170s of the insulating pattern 170. For example, the lower electrode 200 may have an L shape.

The capacitor dielectric layer 250 may extend along the first sidewall 200ss1 of the lower electrode 200. However, the capacitor dielectric layer 250 does not extend along the second sidewall 200ss2 of the lower electrode 200. The capacitor dielectric layer 250 is not disposed between the second sidewall 200ss2 of the lower electrode 200 and the sidewall 170s of the insulating pattern 170. The capacitor dielectric layer 250 extends along the upper surface 170us of the insulating pattern 170.

Figure 15:
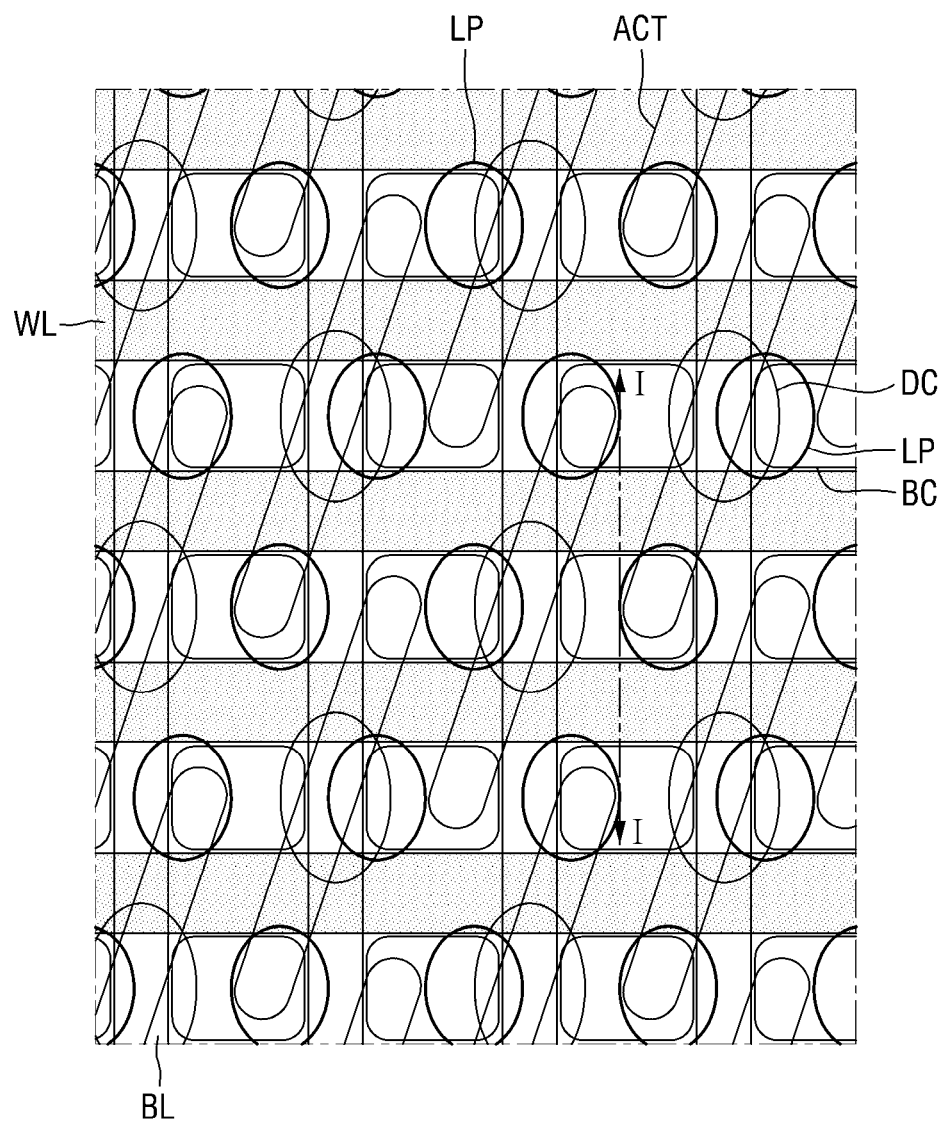
FIG. 15 is a schematic layout diagram illustrating a semiconductor device according to some embodiments.
Figure 16:
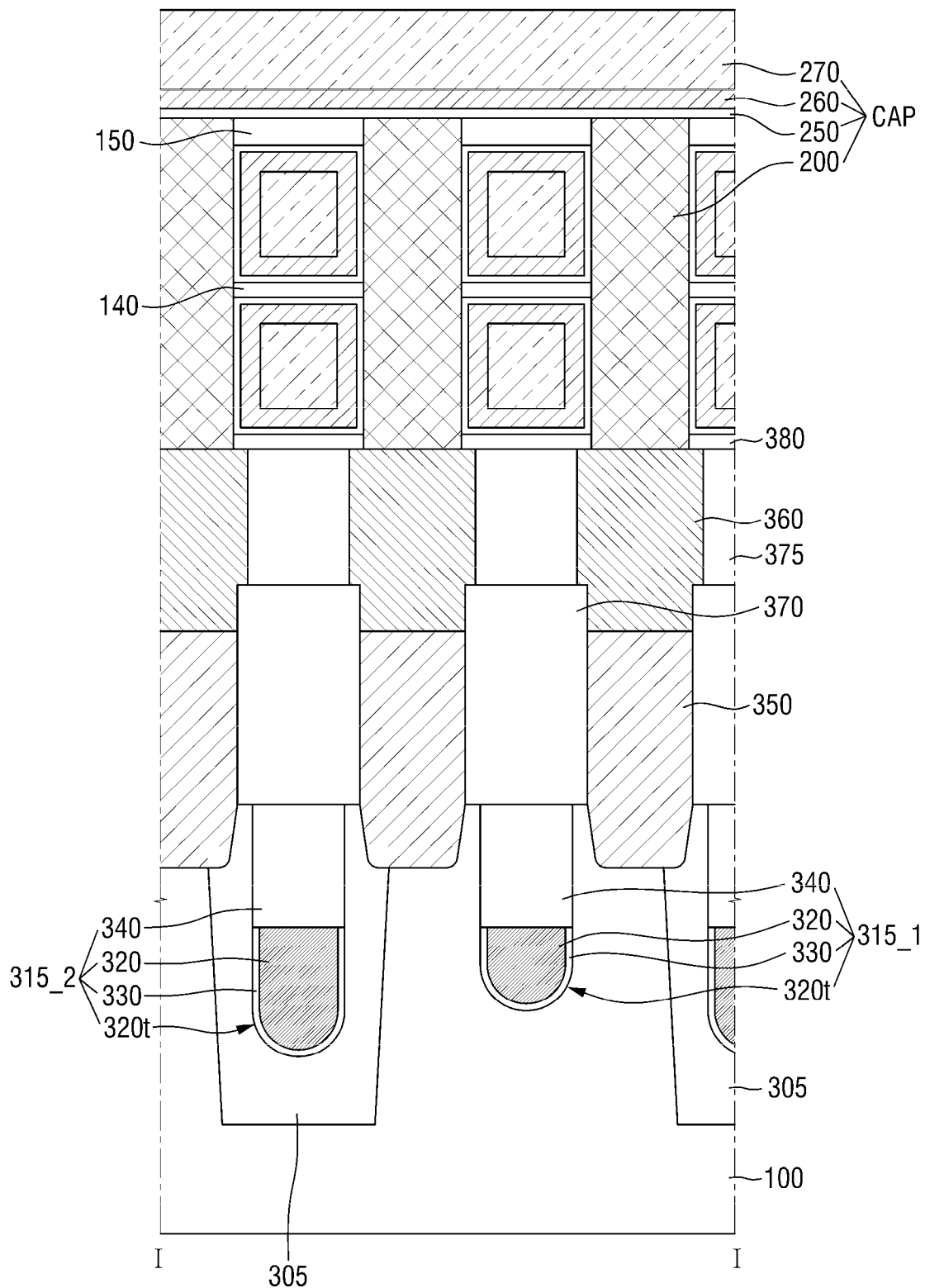
FIG. 16 is a cross-sectional view taken along line I-I of FIG. 15.

FIG. 15 is a schematic layout diagram illustrating a semiconductor device according to some embodiments. FIG. 16 is a cross-sectional view taken along line I-I of FIG. 15.

Although FIG. 15 illustrates an example layout diagram of a dynamic random access memory (DRAM) including a capacitor CAP, the present disclosure is not limited thereto. In addition, a fourth direction DR4 of FIG. 15 may correspond to the first direction DR1 of FIG. 1.

Referring to FIG. 15, a semiconductor device according to some embodiments may include a plurality of active regions ACT. The active region ACT may be defined by a device isolation layer 305 (see FIG. 16) formed in the substrate 100 (see FIG. 16).

As the design rule of the semiconductor device decreases, as illustrated, the active region ACT may be disposed in a diagonal or oblique bar shape. The active region ACT may have a bar shape extending in a fifth direction DR5.

On the active regions ACT, a plurality of gate electrodes may be disposed in the third direction DR3 across the active regions ACT. The plurality of gate electrodes may extend in parallel to each other. The plurality of gate electrodes may be, for example, a plurality of word lines WL.

The word lines WL may be arranged at equal intervals. The width of the word line WL or the interval between the word lines WL may be determined according to the design rule.

On the word lines WL, a plurality of bit lines BL extending in the fourth direction DR4 perpendicular to the word lines WL may be disposed. The plurality of bit lines BL may extend in parallel to each other.

The bit lines BL may be arranged at equal intervals. The width of the bit line BL or the interval between the bit lines BL may be determined according to the design rule.

The semiconductor device according to some embodiments may include various contact arrangements formed on the active regions ACT. Various contact arrangements may include, for example, direct contacts (DC), buried contacts (BC), landing pads (LP), and the like.

Here, the direct contact DC may refer to a contact electrically connecting the active region ACT to the bit line BL. The buried contact BC may refer to a contact electrically connecting the active region ACT to the lower electrode 200 (see FIG. 16) of the capacitor CAP (see FIG. 16).

In the arrangement structure, the contact area between the buried contact BC and the active region ACT may be small. Accordingly, in order to increase the contact area with the active region ACT and to increase the contact area with the lower electrode 200 (see FIG. 16), a conductive second landing pad LP may be introduced.

The second landing pad LP may be disposed between the active region ACT and the buried contact BC, or may be disposed between the buried contact BC and the lower electrode 200 of the capacitor CAP. In the semiconductor device according to some embodiments, the second landing pad LP may be disposed between the buried contact BC and the lower electrode 200 of the capacitor CAP. By expanding the contact area through the introduction of the second landing pad LP, the contact resistance between the active region ACT and the lower electrode 200 of the capacitor CAP can be reduced.

In the semiconductor device according to some embodiments, the direct contact DC may be disposed in a central portion of the active region ACT. The buried contacts BC may be disposed at both (i.e., opposite) ends of the active region ACT.

As the buried contacts BC are disposed at both ends of the active region ACT, the second landing pads LP may be disposed adjacent to both ends of the active region ACT to partially overlap the buried contacts BC.

In other words, the buried contacts BC may be formed to overlap the device isolation layer 305 (see FIG. 16) and the active regions ACT between the adjacent word lines WL and between the adjacent bit lines BL.

The word lines WL may be formed to be buried in the substrate 100. The word lines WL may be disposed across the active regions ACT between the direct contacts DC or the buried contacts BC.

As illustrated, two word lines WL may be disposed to cross one active region ACT. Since the active region ACT is disposed in an oblique shape, the word line WL may have an angle of less than 90 degrees with respect to the active region ACT.

The direct contacts DC and the buried contacts BC may be arranged symmetrically. Accordingly, the direct contacts DC and the buried contacts BC may be disposed in a straight line along the third direction DR3 and the fourth direction DR4.

On the other hand, unlike the direct contacts DC and the buried contacts BC, the second landing pads LP may be arranged in a zigzag shape in the fourth direction DR4 in which the bit line BL extends. Further, the second landing pads LP may be disposed to overlap the same side surface of each bit line BL in the third direction DR3 in which the word line WL extends.

For example, each of the second landing pads LP in a first line may overlap a left side surface of the corresponding bit line BL, and each of the second landing pads LP in a second line may overlap a right side surface of the corresponding bit line BL.

Referring to FIGS. 15 and 16, the semiconductor device according to some embodiments may include gate structures 315_1 and 315_2, a second storage contact 350, and a capacitor CAP.

The device isolation layer 305 may be formed in the substrate 100. The device isolation layer 305 may have a shallow trench isolation (STI) structure having excellent device isolation characteristics. The device isolation layer 305 may define the active region ACT on the substrate 100.

The active region ACT defined by the device isolation layer 305 may have a long island shape having a short axis and a long axis, as shown in FIG. 15. The active region ACT may have an oblique shape to have an angle of less than 90 degrees with respect to the word line WL formed in the device isolation layer 305.

Further, the active region ACT may have an oblique shape to have an angle of less than 90 degrees with respect to the bit line BL formed on the device isolation layer 305. That is, the active region ACT may extend in a fifth direction DR5 having a predetermined angle with respect to the third and fourth directions DR3 and DR4.

The gate structures 315_1 and 315_2 may be formed in the substrate 100 and the device isolation layer 305. The gate structures 315_1 and 315_2 may be formed across the device isolation layer 305 and the active region ACT defined by the device isolation layer 305.

The gate structures 315_1 and 315_2 include a gate structure 315_1 in the active region ACT of the substrate 100 and a gate structure 315_2 in the device isolation layer 305.

The gate structures 315_1 and 315_2 may include a buried gate trench 320*t* formed in the substrate 100 and the device isolation layer 305, a gate insulating layer 330, a gate electrode 320, and a gate block pattern 340. The gate electrode 320 may correspond to the word line WL.

For example, the depth of the buried gate trench 320*t* formed in the substrate 100 may be different from the depth of the buried gate trench 320*t* formed in the device isolation layer 305.

The gate insulating layer 330 may extend along the sidewall and the bottom surface of the buried gate trench 320*t*. The gate insulating layer 330 may extend along the profile of at least a portion of the buried gate trench 320*t*.

The gate insulating layer 330 may include, for example, at least one of silicon oxide, silicon oxynitride, silicon nitride, or a high dielectric constant material having a higher dielectric constant than silicon oxide.

The high dielectric constant material may include, for example, at least one selected from the group consisting of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

The gate electrode 320 may be formed on the gate insulating layer 330. The gate electrode 320 may fill a portion of the buried gate trench 320*t*.

The gate electrode 320 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), impurity-doped polysilicon, impurity-doped polysilicon germanium and a combination thereof. The gate electrode 320 may include conductive metal oxide, conductive metal oxynitride or the like, and may include an oxidized form of the aforementioned material.

The gate block pattern 340 may be formed on the gate electrode 320. The gate block pattern 340 may fill the remaining portion of the buried gate trench 320t in which the gate electrode 320 is formed. The gate block pattern 340 may include, for example, at least one of silicon nitride (SiN), silicon oxynitride (SiON), silicon oxide ($SiO_2$), silicon carbonitride (SiCN), silicon oxycarbonitride (SiOCN), or a combination thereof.

A third lower interlayer insulating layer 370 may be disposed on the substrate 100 and the device isolation layer 305. The third lower interlayer insulating layer 370 may cover the gate structures 315_1 and 315_2.

The second storage contact 350 may be formed in the third lower interlayer insulating layer 370. The second storage contact 350 may be connected to the substrate 100. More specifically, the second storage contact 350 may be electrically connected to the source/drain region formed in the active region ACT of the substrate 100.

The second storage contact 350 may be disposed on at least one side of the gate structures 315_1 and 315_2. For example, the second storage contacts 350 may be disposed at both (i.e., opposite) sides of the gate structures 315_1 and 315_2. The second storage contact 350 may correspond to the buried contact BC.

In addition, the second storage contact 350 may correspond to the first storage contact 115 of FIGS. 1 to 14.

A storage pad 360 may be formed on the second storage contact 350. The storage pad 360 may be electrically connected to the second storage contact 350. Here, the storage pad 360 may correspond to the second landing pad LP.

Further, the storage pad 360 may correspond to the first landing pad 120 of FIGS. 1 to 14.

A third upper interlayer insulating layer 375 may be formed on the third lower interlayer insulating layer 370. The third upper interlayer insulating layer 375 may surround the storage pad 360. The third upper interlayer insulating layer 375 and the third lower interlayer insulating layer 370 may correspond to the first interlayer insulating layer 110 of FIGS. 1 to 13.

A lower electrode etch stop layer 380 may be formed on the third upper interlayer insulating layer 375 and the storage pad 360. The lower electrode etch stop layer 380 may correspond to the etch stop layer 130 of FIGS. 1 to 14.

The capacitor CAP may be disposed on the storage pad 360. The capacitor CAP may be connected to the storage pad 360. That is, the capacitor CAP may be electrically connected to the second storage contact 350.

The capacitor CAP may include a lower electrode 200, a capacitor dielectric layer 250, an upper electrode 260, and an upper plate electrode 270. A lower supporter pattern 140 and an upper supporter pattern 150 may be formed on the lower electrode etch stop layer 380.

The lower electrode 200, the capacitor dielectric layer 250, the upper electrode 260, and the upper plate electrode 270 included in the capacitor CAP are substantially the same as those described with reference to FIGS. 1 to 14.

FIGS. 17 to 21 are diagrams illustrating the intermediate steps of a method for fabricating a semiconductor device according to some embodiments.

Figure 17:
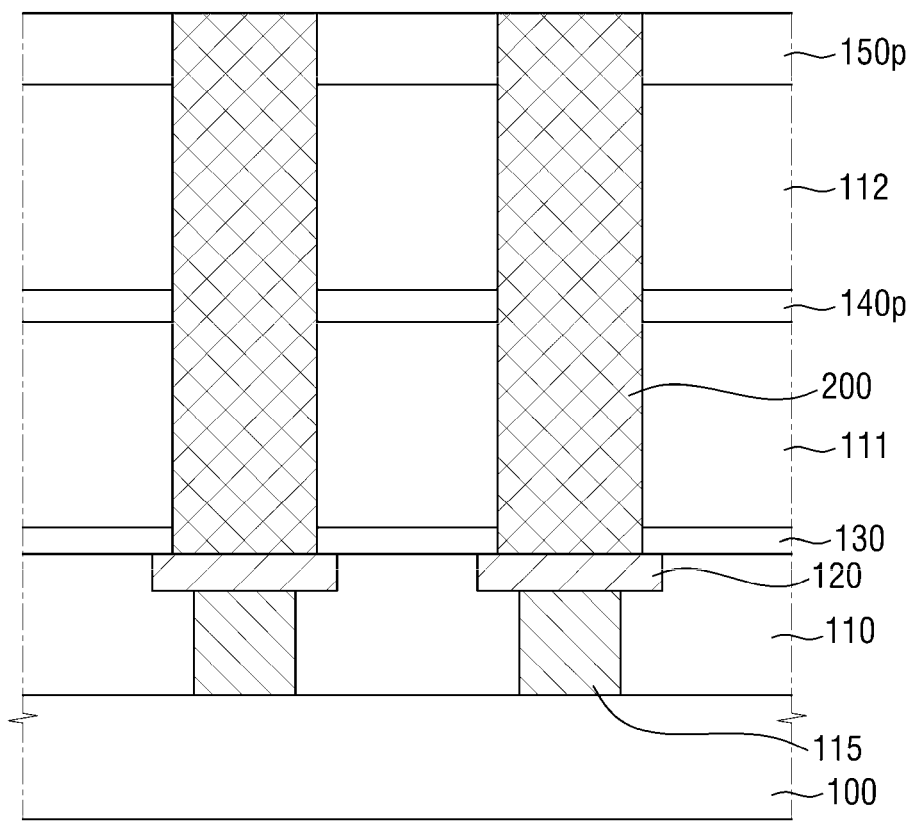
FIGS. 17 to 21 are diagrams illustrating the intermediate steps of a method for fabricating a semiconductor device according to some embodiments.

Referring to FIG. 17, the first storage contact 115 and the first landing pad 120 may be formed in the first interlayer insulating layer 110 on the substrate 100.

The etch stop layer 130, a lower mold layer 111, a lower supporter layer 140p, an upper mold layer 112 and an upper supporter layer 150p may be sequentially formed on the first interlayer insulating layer 110.

On the first landing pad 120, the lower electrode 200 may be formed to pass through the etch stop layer 130, the lower mold layer 111, the lower supporter layer 140p, the upper mold layer 112 and the upper supporter layer 150p.

Figure 18:
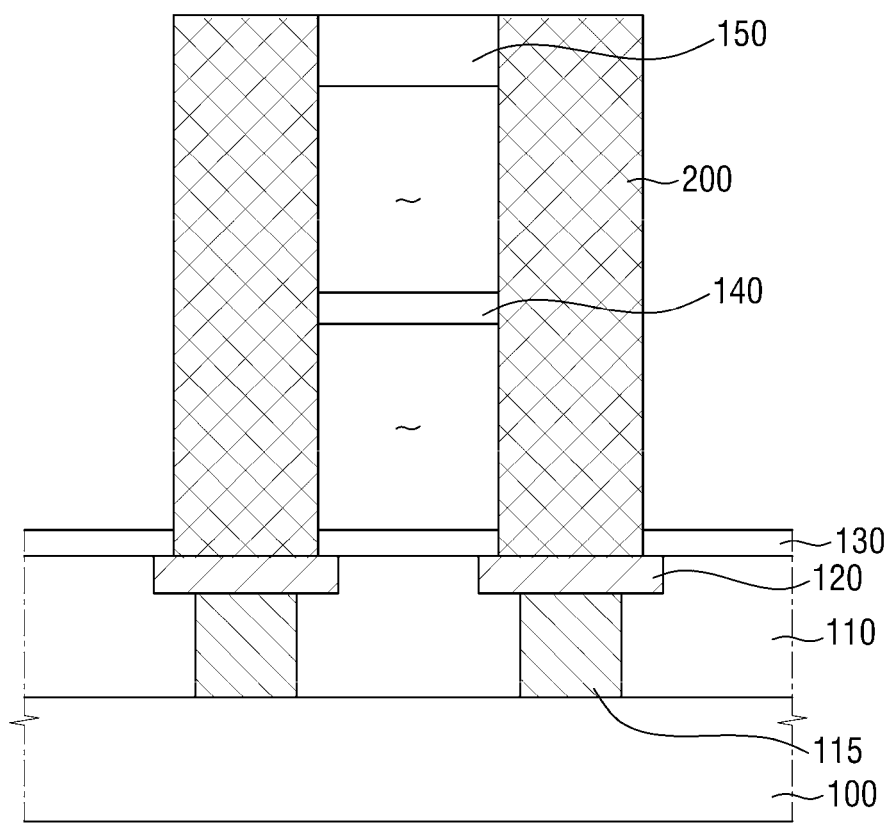

Referring to FIG. 18, the upper supporter pattern 150 and the lower supporter pattern 140 connecting the adjacent lower electrodes 200 may be formed. Each of the upper supporter pattern 150 and the lower supporter pattern 140 may be in contact with portions of the sidewalls of the lower electrodes 200.

The upper supporter pattern 150 may be formed by removing a portion of the upper supporter layer 150p. The upper mold layer 112 may be removed through a region where the upper supporter pattern 150 is not formed.

Subsequently, the lower supporter pattern 140 may be formed by removing a portion of the lower supporter layer 140p. The lower mold layer 111 may be removed through a region where the lower supporter pattern 140 is not formed.

Thus, a space may be formed between the upper supporter pattern 150 and the lower supporter pattern 140 and between the lower supporter pattern 140 and the etch stop layer 130.

Figure 19:
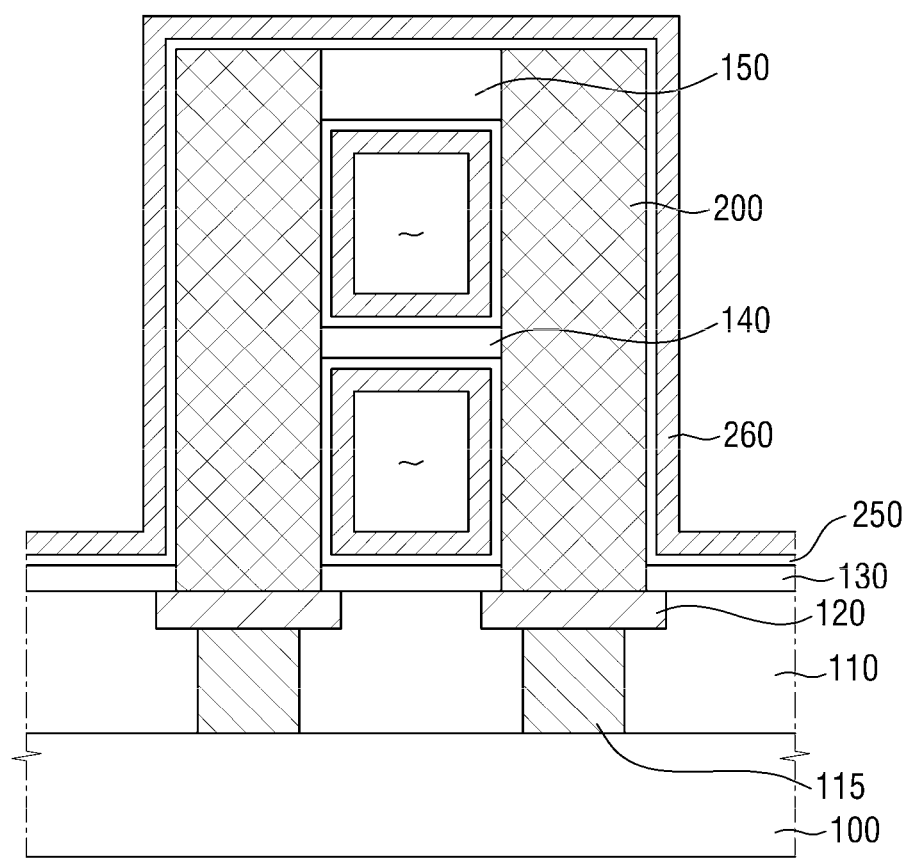

Referring to FIG. 19, the capacitor dielectric layer 250 may be formed on the lower electrode 200.

The capacitor dielectric layer 250 may be formed along the top and side surfaces of the lower electrode 200, the bottom and top surfaces of the lower supporter pattern 140, the bottom and top surfaces of the upper supporter pattern 150, and the top surface of the etch stop layer 130. The capacitor dielectric layer 250 may be formed along the profile of the lower electrode 200, the upper supporter pattern 150, the lower supporter pattern 140 and the etch stop layer 130.

The upper electrode 260 may be formed on the capacitor dielectric layer 250. The upper electrode 260 may be formed along the profile of the capacitor dielectric layer 250.

Figure 20:
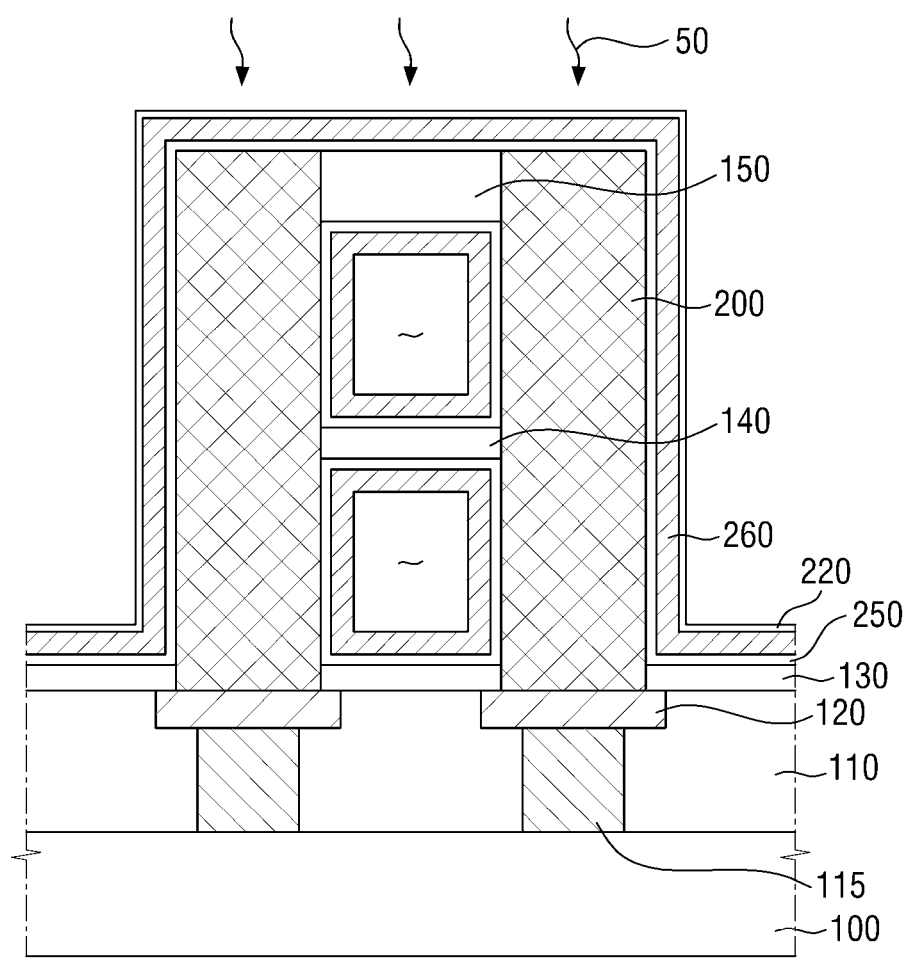

Referring to FIG. 20, an interface layer 220 may be formed on the upper electrode 260 through a surface treatment process 50. The interface layer 220 may be formed along the profile of the upper electrode 260.

The interface layer 220 may include fluorine (F). For example, the surface treatment process 50 may be performed using a first precursor containing a semiconductor element (e.g., silicon or germanium) and a second precursor containing fluorine (F). The second precursor may include, but is not limited to, nitrogen trifluoride ($NF_3$).

As an example, the interface layer 220 may be a semiconductor material layer doped with fluorine (F). As another example, the interface layer 220 may be an interface portion of the upper electrode 260 treated with fluorine (F).

Figure 21:
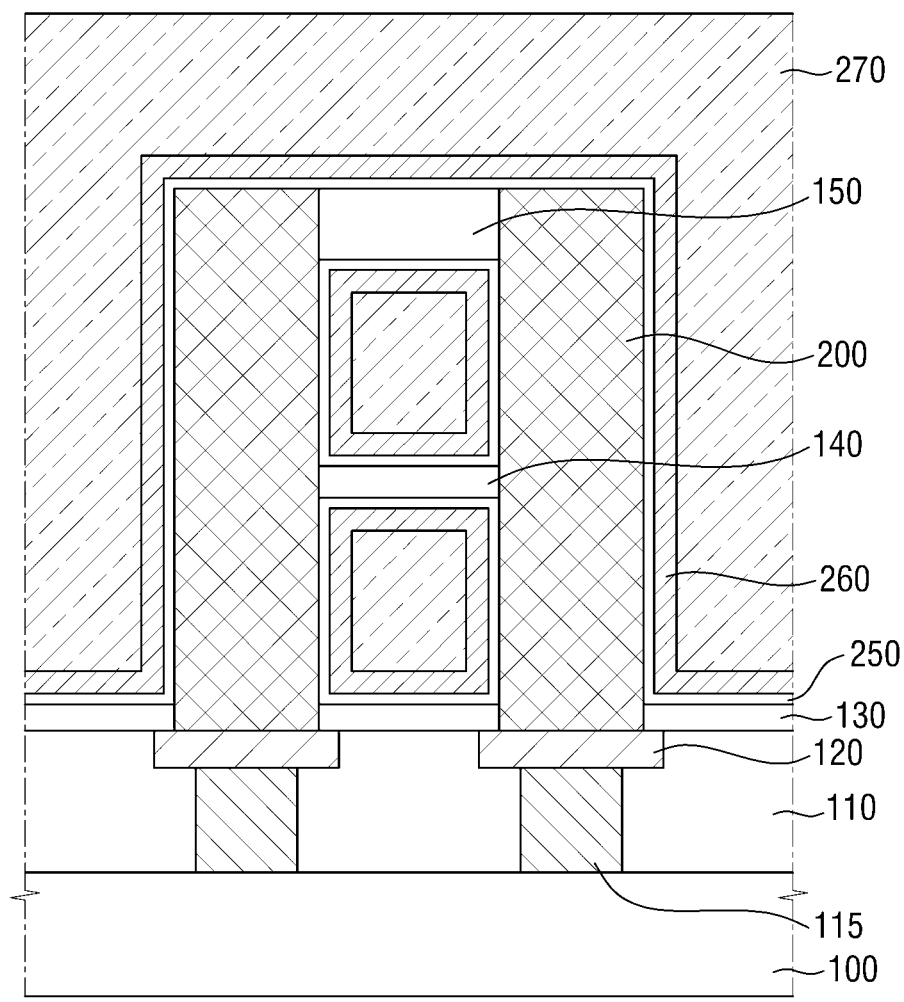

Referring to FIG. 21, after forming the interface layer 220, the upper plate electrode 270 may be formed on the upper electrode 260.

The interface layer 220 may be included in the upper plate electrode 270. As a result, the upper plate electrode 270 doped with fluorine (F) may be formed.

Unlike the above description, before the capacitor dielectric layer 250 is formed, an interface layer including fluorine (F) may be further formed on the exposed lower electrode 200.

Unlike the above description, the interface layer 220 may be the first plate electrode layer 271 of FIG. 7.

While the present inventive concept has been shown and described with reference to example embodiments thereof, it will be apparent to those of ordinary skill in the art that various modifications in form and details may be made thereto without departing from the scope of the present inventive concept as set forth by the appended claims.

What is claimed is:

1. A semiconductor device comprising:
   a landing pad on a substrate;
   a lower electrode on the landing pad, the lower electrode being electrically connected to the landing pad;
   a dielectric layer on the lower electrode, the dielectric layer extending along a profile of the lower electrode;
   an upper electrode on the dielectric layer and including first fluorine therein; and
   an upper plate electrode on the upper electrode and including the first fluorine therein,
   wherein the upper plate electrode includes an interface facing the upper electrode,
   wherein a concentration of the first fluorine in the upper plate electrode is highest at the interface,
   wherein the upper electrode includes a first surface facing the dielectric layer and a second surface facing the upper plate electrode, and
   wherein a concentration of the first fluorine in the upper electrode decreases from the second surface of the upper electrode to the first surface of the upper electrode.

2. The semiconductor device of claim 1, wherein the upper plate electrode includes a compound semiconductor material layer.

3. The semiconductor device of claim 1,
   wherein the upper plate electrode includes a first plate electrode layer on the upper electrode and a second plate electrode layer on the first plate electrode layer, and
   wherein the first plate electrode layer includes an element semiconductor material layer, and the second plate electrode layer includes a compound semiconductor material layer.

4. The semiconductor device of claim 1, further comprising:
   a passivation layer between the dielectric layer and the upper electrode,
   wherein the passivation layer includes the first fluorine therein.

5. The semiconductor device of claim 1, wherein a portion of the dielectric layer includes the first fluorine therein.

6. The semiconductor device of claim 1,
   wherein the lower electrode includes second fluorine therein, and
   wherein a concentration of the second fluorine in the lower electrode is highest at an interface of the lower electrode facing the dielectric layer.

7. The semiconductor device of claim 1, wherein the lower electrode has a rectangular shape or a cylindrical shape extending in a thickness direction of the substrate.

8. The semiconductor device of claim 1, wherein the lower electrode includes a bottom portion extending along a top surface of the landing pad and a sidewall portion protruding from an end of the bottom portion.

9. A semiconductor device comprising:
   a landing pad on a substrate;
   a lower electrode on the landing pad, the lower electrode being electrically connected to the landing pad;
   a dielectric layer on the lower electrode, the dielectric layer extending along a profile of the lower electrode;
   an upper electrode on the dielectric layer; and
   an upper plate electrode including a lower plate region on the upper electrode and an upper plate region,
   wherein the lower plate region is between the upper electrode and the upper plate region, and
   wherein the lower plate region includes fluorine therein and the upper plate region does not include fluorine.

10. The semiconductor device of claim 9,
    wherein the upper plate electrode includes an interface facing the upper electrode, and
    wherein a concentration of the fluorine in the lower plate region decreases as a distance from the interface of the upper plate electrode increases.

11. The semiconductor device of claim 9,
    wherein the upper electrode includes the fluorine therein, and
    wherein the upper electrode, the lower electrode, the dielectric layer, and the upper plate electrode are included in a capacitor of the semiconductor device.

12. The semiconductor device of claim 9, wherein the upper plate electrode includes a compound semiconductor material layer.

13. The semiconductor device of claim 9,
    wherein the upper plate electrode includes a first plate electrode layer on the upper electrode and a second plate electrode layer on the first plate electrode layer,
    wherein the first plate electrode layer includes an element semiconductor material layer, and the second plate electrode layer includes a compound semiconductor material layer, and
    wherein the first plate electrode layer is included in the lower plate region.

14. A semiconductor device comprising:
    a trench in a substrate;
    a gate electrode in the trench;
    a buried contact on at least one side of the gate electrode and electrically connected to the substrate;
    a landing pad; and
    a capacitor electrically connected to the landing pad,
    wherein the capacitor includes a lower electrode electrically connected to the landing pad, a dielectric layer on the lower electrode, an upper electrode on the dielectric layer, and an upper plate electrode on the upper electrode,
    wherein the upper plate electrode includes fluorine,
    wherein the upper plate electrode includes a portion in which a concentration of the fluorine decreases as a distance from the upper electrode increases, and
    wherein the upper plate electrode comprises a compound semiconductor material layer and an element semiconductor material layer that is between the compound semiconductor material layer and the upper electrode.

15. The semiconductor device of claim 14, wherein the upper electrode includes the fluorine.

16. The semiconductor device of claim 14,
    wherein the compound semiconductor material layer of the upper plate electrode comprises a silicon germanium layer, and
    wherein the portion comprises a portion of the silicon germanium layer.

17. The semiconductor device of claim 16, wherein the element semiconductor material layer of the upper plate electrode comprises a silicon layer.

18. The semiconductor device of claim 14, wherein the upper plate electrode includes a lower plate region including the fluorine and an upper plate region not including the fluorine.

* * * * *